(12) United States Patent
Masuoka et al.

(10) Patent No.: US 6,627,490 B2
(45) Date of Patent: Sep. 30, 2003

(54) SEMICONDUCTOR DEVICE AND METHOD FOR FABRICATING THE SAME

(75) Inventors: Sadaaki Masuoka, Tokyo (JP); Kiyotaka Imai, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/222,557

(22) Filed: Aug. 16, 2002

(65) Prior Publication Data

US 2003/0001175 A1 Jan. 2, 2003

Related U.S. Application Data

(62) Division of application No. 09/649,107, filed on Aug. 28, 2000, now Pat. No. 6,472,714.

(30) Foreign Application Priority Data

Aug. 30, 1999 (JP) .............................. 11-244139

(51) Int. Cl.[7] .......................................... H01L 21/8238
(52) U.S. Cl. ...................... 438/200; 438/217; 438/231
(58) Field of Search ................................ 438/200, 217, 438/223, 224, 231, 232, 275, 276

(56) References Cited

U.S. PATENT DOCUMENTS

| | | | | |
|---|---|---|---|---|
| 5,075,242 A | * | 12/1991 | Nakahara | 438/217 |
| 5,241,208 A | | 8/1993 | Taguchi | 257/410 |
| 5,424,226 A | * | 6/1995 | Vo et al. | 438/217 |
| 5,624,863 A | * | 4/1997 | Helm et al. | 438/231 |
| 5,674,763 A | * | 10/1997 | Sugiura et al. | 438/200 |
| 6,100,568 A | | 8/2000 | Lage | 257/371 |
| 6,274,914 B1 | | 8/2001 | Park et al. | 257/371 |

FOREIGN PATENT DOCUMENTS

| | | | | |
|---|---|---|---|---|
| EP | 0 543 489 A1 | 5/1993 | | H01L/27/11 |
| EP | 0 716 454 A2 | 6/1996 | | H01L/29/10 |
| GB | 2 120 844 A | 12/1983 | | H01L/27/04 |
| JP | 8-97378 | 4/1996 | | H01L/27/08 |
| JP | 08-213478 | 8/1996 | | H01L/21/8238 |
| JP | 09-129743 | 5/1997 | | H01L/21/8234 |
| JP | 10-189766 | 7/1998 | | H01L/21/8238 |
| WO | 83/02197 | 6/1983 | | H01L/21/82 |

* cited by examiner

Primary Examiner—Chandra Chaudhari
(74) Attorney, Agent, or Firm—Hayes Soloway P.C.

(57) ABSTRACT

A core section complementary transistor and a memory cell section complementary transistor are formed on a semiconductor substrate of a first conductivity type. The core section complementary transistor has a first well of a second conductivity type provided in the semiconductor substrate, a first core section MOS transistor provided on the first well of the second conductivity type, a second core section MOS transistor provided on the semiconductor substrate a device separation film which separates the first core section MOS transistor and the second core section MOS transistor from each other, and a well of the first conductivity type provided under a part of the device separation film which is closer to the second core section MOS transistor. The first core section MOS transistor has source-drain regions of the first conductivity type. The second core section MOS transistor has source-drain regions of the second conductivity type. The well of the first conductivity type has an impurity concentration higher than that of the semiconductor substrate.

12 Claims, 34 Drawing Sheets

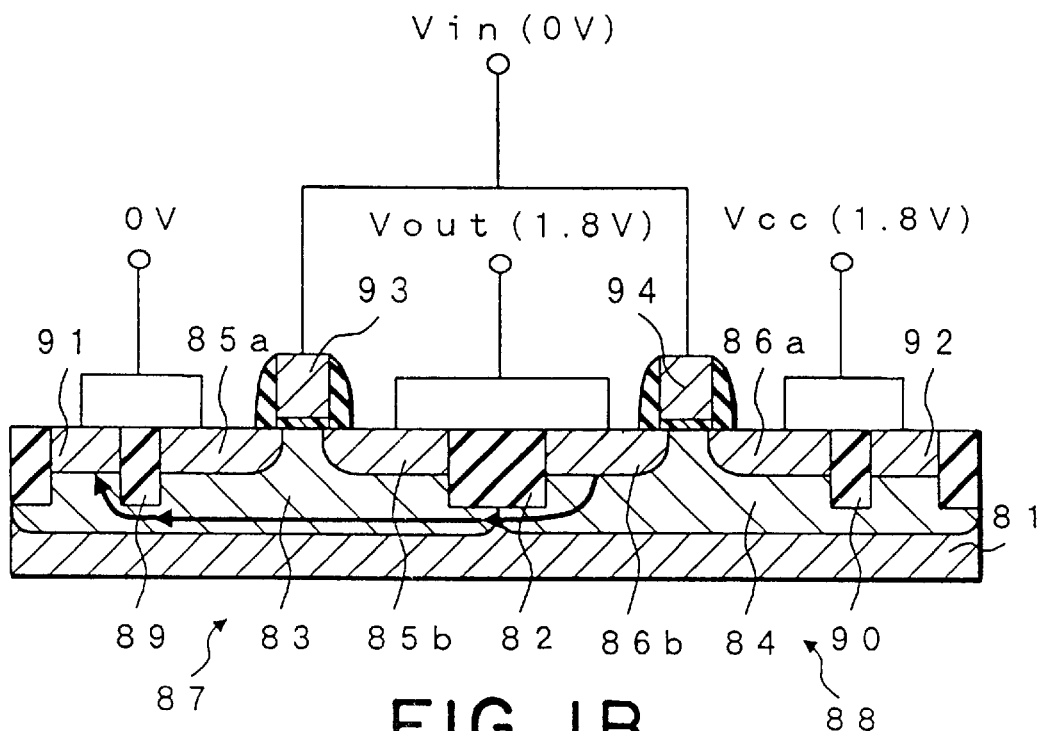
FIG. IA
(PRIOR ART)
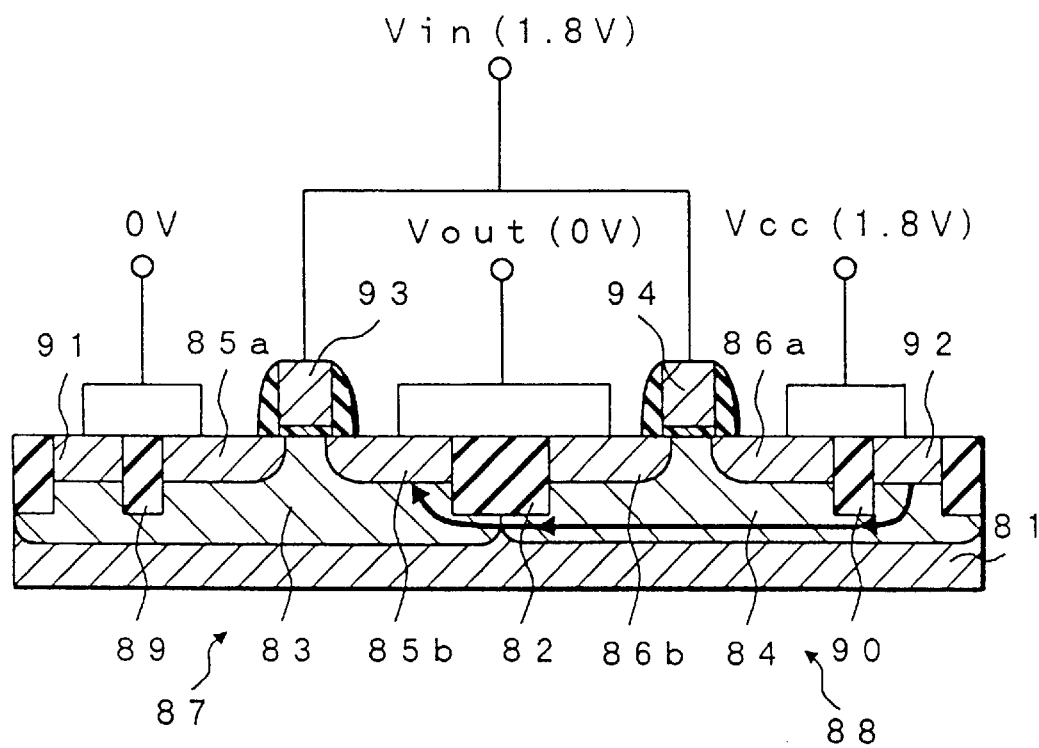
FIG. IB
(PRIOR ART)

SEMICONDUCTOR DEVICE AND METHOD FOR FABRICATING THE SAME

This application is a divisional application of U.S. application Ser. No. 09/649,107 now U.S. Pat. No. 6,472,714 filed Aug. 28, 2000.

BACKGROUND OF THE INVENTION

1. Field of the Invention

The present invention relates to a semiconductor device in which memory cells and peripheral circuits (core) thereof are provided on the same substrate; and a method for fabricating such a device. More particularly, the present invention relates to a semiconductor device having a reduced area occupied by the core section and an improved operating speed; and a method for fabricating such a device.

2. Description of the Related Art

In recent years, the degree of integration of a semiconductor device has been increased. In a system-on-chip (SOC) device, memory cells and peripheral circuits (core) such as a central processing unit (CPU) for controlling the operation of the memory cells are formed on the same substrate. In such a SOC device, the memory cells are required to stably maintain data therein even when an α ray is incident thereon, i.e., to have a soft error resistance, and the core is required to increase the operating speed of logical circuits thereof. Therefore, in the case where the memory cells form an SRAM (static random access memory), it is necessary to increase the source-drain junction capacitance of each CMOS (complementary metal-oxide semiconductor) transistor in the SRAM section, while decreasing the source-drain junction capacitance of each CMOS transistor in the core section.

However, the following problems arise when an impurity concentration of a well of each circuit in the core section is reduced in order to reduce the junction capacitance in the core section. Each of FIG. 1A and FIG. 1B shows a cross-sectional view illustrating punch-through occurring under a device separation region in a conventional CMOS transistor. As shown in FIG. 1A and FIG. 1B, in the CMOS transistor, a p-well 83 and an n-well 84 are provided on the surface of a semiconductor substrate 81 and separated from each other by a device separation film 82. The CMOS transistor includes an n-channel MOS transistor 87 and a p-channel MOS transistor 88. The n-channel MOS transistor 87 includes an n$^+$-source diffusion layer 85a and an n$^+$-drain diffusion layer 85b provided at the surface of the p-well 83. The p-channel MOS transistor 88 includes a p$^+$-source diffusion layer 86a and a p$^+$-drain diffusion layer 86b provided at the surface of the n-well 84.

Moreover, a p$^+$-well contact layer 91 isolated from the n$^+$-source diffusion layer 85a by an insulating film 89 is provided at the surface of the p-well 83, and an n$^+$-well contact layer 92 isolated from the p$^+$-source diffusion layer 86a by an insulating film 90 is provided at the surface of the n-well 84.

In the thus-structured CMOS transistor, when 0(V) is applied to gate electrodes 93 and 94, 1.8(V) to the n$^+$-drain diffusion layer 85b and the p$^+$-drain diffusion layer 86b, 0(V) to the n$^+$-source diffusion layer 85a and the p$^+$-well contact layer 91, and 1.8(V) to the p$^+$-source diffusion layer 86a and the n$^+$-well contact layer 92, as shown in FIG. 1A, punch-through between the p$^+$-drain diffusion layer 86b and the p$^+$-well contact layer 91 is likely to occur under the device separation film 82 and the insulating film 89 via the n-well 84 and the p-well 83.

When 1.8(V) is applied to the gate electrodes 93 and 94, 0(V) to the n$^+$-drain diffusion layer 85b and the p$^+$-drain diffusion layer 86b, 0(V) to the n$^+$-source diffusion layer 85a and the p$^+$-well contact layer 91, and 1.8(V) to the p$^+$-source diffusion layer 86a and the n$^+$-well contact layer 92, as shown in FIG. 1B, punch-through between the n$^+$-well contact layer 92 and the n$^+$-drain diffusion layer 85b is likely to occur under the device separation film 82 and the insulating film 90 via the n-well 84 and the p-well 83. Hereinafter, such punch-through is referred to as "well-to-well punch-through".

When the impurity concentration of an area, e.g., a well, near the area where the source-drain diffusion layer of the CMOS transistor is to be formed is reduced in order to reduce the junction capacitance, punch-through is more likely to occur under the device separation region.

Conventionally, the above-described problem has been addressed as follows. In the core section, the impurity concentration of the well is reduced while increasing the width of the device separation film disposed between the pMOS and the nMOS which together form the CMOS. FIG. 2A and FIG. 2B through FIG. 12A and FIG. 12B show cross-sectional views sequentially illustrating the steps of a conventional method for fabricating a semiconductor device. In these figures, each of FIG. 2A through FIG. 12A shows a region corresponding the core section of the semiconductor device, and each of FIG. 2B through FIG. 12B shows a region corresponding to the SRAM section of the semiconductor device.

First, as shown in FIG. 2A and FIG. 2B, a p$^-$-epitaxial layer 52 is formed on a p-type silicon substrate 51 in both of the core section and the SRAM section. Next, in the core section, a device separation film 53a is formed in a predetermined area at the surface of the p$^-$-epitaxial layer 52, and in the SRAM section, a device separation film 53b is formed in a predetermined area at the surface of the p$^-$-epitaxial layer 52. As a result, the core section is defined into an nMOS region 111 where an n-channel MOS transistor is to be formed, and a pMOS region 112 where a p-channel MOS transistor is to be formed. The SRAM section is defined into an nMOS region 113 where an n-channel MOS transistor is to be formed, and a pMOS region 114 where a p-channel MOS transistor is to be formed. The width of the device separation film 53a is, for example, 1.2 μm, and the width of the device separation film 53b is, for example, 0.4 μm. Thereafter, a sacrificial oxide film (not shown) is formed over the entire surface of the device.

Next, as shown in FIG. 3A and FIG. 3B, a resist 54 including an opening 54a is formed. The opening 54a extends over the nMOS region 111 and a part of the device separation film 53a which is closer to the nMOS region 111, and the resist 54 completely covers the SRAM section. The size of a portion of the opening 54a which is located over the device separation film 53a is about a half of the size of the device separation film 53a. Next, B$^+$ ions are implanted using the resist 54 as a mask with an acceleration voltage of 300 keV and a dose of 1.5×10$^{13}$, for example. Thus, in the core section, a p-type well 55 which is deeper than the device separation film 53a is formed in the p$^-$-epitaxial layer 52.

As shown in FIG. 4A and FIG. 4B, a resist 56 including an opening 56a is formed after removing the resist 54. The opening 56a is provided in the center of the nMOS region 111, and the resist 56 completely covers the SRAM section. Next, B$^+$ ions are implanted using the resist 56 as a mask with an acceleration voltage of 30 keV and a dose of 8×10$^{12}$, for example, so as to form a p-type channel 57 at an intermediate depth of the p⁻-epitaxial layer 52.

As shown in FIG. 5A and FIG. 5B, a resist 58 including an opening 58a is formed after removing the resist 56. The opening 58a extends over the nMOS region 113 and a part of the device separation film 53b which is closer to the nMOS region 113, and the resist 58 completely covers the core section. Next, in the SRAM section, B⁺ ions are implanted using the resist 58 as a mask, for example, with an acceleration voltage of 150 keV and a dose of 2×10¹³, so as to form a p-type well 59 in the p⁻-epitaxial layer 52. Moreover, B⁺ ions are implanted using the resist 58 as a mask, for example, with an acceleration voltage of 30 keV and a dose of 1.5×10¹³, so as to form a p-type channel 60 in the p-type well 59.

As shown in FIG. 6A and FIG. 6B, a resist 61 including an opening 61a is formed after removing the resist 58. The opening 61a extends over the pMOS region 112 and a part of the device separation film 53a which is closer to the pMOS region 112, and the resist 61 completely covers the SRAM section. Next, in the core section, P⁺ ions are implanted using the resist 61 as a mask with an acceleration voltage of 600 keV and a dose of 1.5×10¹³, for example, so as to form an n-type well 62 in the p⁻-epitaxial layer 52.

As shown in FIG. 7A and FIG. 7B, a resist 63 including an opening 63a is formed after removing the resist 61. The opening 63a is provided in the center of the pMOS region 112, and the resist 63 completely covers the SRAM section. Next, in the core section, As⁺ ions are implanted using the resist 63 as a mask, for example, with an acceleration voltage of 100 keV and a dose of 3×10¹², so as to form an n-type channel 64 at an intermediate depth of the n-type well 62.

As shown in FIG. 8A and FIG. 8B, a resist 65 including an opening 65a is formed after removing the resist 63. The opening 65a extends over the pMOS region 114 and a part of the device separation film 53b which is closer to the pMOS region 114, and the resist 65 completely covers the core section. Next, in the SRAM section, P⁺ ions are implanted using the resist 65 as a mask, for example, with an acceleration voltage of 350 keV and a dose of 2×10¹³, so as to form an n-type well 66 in the p⁻-epitaxial layer 52. Furthermore, As⁺ ions are implanted, for example, with an acceleration voltage of 100 keV and a dose of 1.4×10¹³, so as to form an n-type channel 67 at an intermediate depth of the n-type well 66.

As shown in FIG. 9A and FIG. 9B, after removing the resist 65, a gate oxide film 68 and a gate electrode 69 are formed in each of the nMOS region 111, the pMOS region 112, the nMOS region 113, and the pMOS region 114.

Next, as shown in FIG. 10A and FIG. 10B, side walls 70 are formed at both sides of the gate oxide film 68 and the gate electrode 69.

Next, as shown in FIG. 11A and FIG. 11B, a resist 71 including openings 71a and 71b is formed. The openings 71a and 71b extend over the nMOS regions 111 and 113, respectively. Next, As⁺ ions are implanted using the resist 71 as a mask, for example, with an acceleration voltage of 20 keV and a dose of 5×10¹⁵, so as to form an n⁺-source-drain diffusion layer 72 in each of the nMOS region 111 and the nMOS region 113.

After removing the resist 71, as shown in FIG. 12A and FIG. 12B, a resist 73 including openings 73a and 73b is formed. The openings 73a and 73b extend over the pMOS regions 112 and 114, respectively. Next, B⁺ ions are implanted using the resist 73 as a mask, for example, with an acceleration voltage of 4 keV and a dose of 5×10¹⁵, so as to form a p⁺-source-drain diffusion layer 74 in each of the pMOS regions 112 and 114.

Thereafter, the implanted ions are activated by means of annealing. Then, wiring or the like is provided so as to complete the semiconductor device.

In order to prevent punch-through under the device separation region, a semiconductor device including a region with a high impurity concentration down below the device separation film has been proposed (Japanese Patent Laid-Open Publication No.8-97378). According to the semiconductor device described in this publication, within a well in which a MOS transistor is formed, a high impurity concentration region is provided so as to extend below a device separation film formed around the transistor.

In a SOC device, however, when an area occupied by the memory cell section (SRAM section) is compared to an area occupied by the core section, the area occupied by the core section is significantly larger than that occupied by the memory cell section. Moreover, in the semiconductor device fabricated according to the conventional method illustrated in FIG. 1A through FIG. 12B, the device separation film 53a has a wide width in the core section. As a result, such problem as a large chip area arises.

Furthermore, according to the semiconductor device disclosed in Japanese Patent Laid-Open Publication No.8-97378, a high impurity concentration region exists below the MOS transistor, thereby influencing a threshold voltage of the MOS transistor. As the degree of integration of the semiconductor device increases, such influence becomes more prominent. In addition, this publication does not contemplate the use of the technique in a SOC device. When this technique is used in a SOC device, the number of production steps may increase. Furthermore, when this technique is used in the core section of a SOC device, the junction capacitance may increase due to the high impurity concentration region, thereby reducing the operating speed.

While these problems are prominent in SOC devices, similar problems will arise in a memory chip itself, considering the peripheral region, e.g., a decoder, as being equivalent to the core section.

SUMMARY OF THE INVENTION

An object of the present invention is to provide a semiconductor device capable of realizing a high-speed operation of a core section where logical circuits are formed, reducing an area occupied by the core section, and preventing punch-through occurring under a device separation region in a CMOS; and a method for fabricating such a semiconductor device.

According to one aspect of the present invention, a semiconductor device comprises, a semiconductor substrate of a first conductivity type, a memory cell section complementary transistor provided on the semiconductor substrate, and a core section complementary transistor provided on the semiconductor substrate. The core section complementary transistor has a first well of a second conductivity type provided in the semiconductor substrate, a first core section MOS transistor provided on the first well of the second conductivity type, a second core section MOS transistor provided on the semiconductor substrate a device separation film which separates the first core section MOS transistor and the second core section MOS transistor from each other, and a well of the first conductivity type provided under a part of the device separation film which is closer to the second core section MOS transistor. The first core section MOS transistor has source-drain regions of the first conductivity type. The second core section MOS transistor has source-drain regions of the second conductivity type. The well of the first conductivity type has an impurity concentration higher than that of the semiconductor substrate.

According to the aspect of the present invention, the well of the first conductivity type having an impurity concentration higher than that of the semiconductor substrate is provided in the core section under the part of the device separation film which is closer to the second core section MOS transistor, thereby improving punch-through resistance under the device separation region. As a result, the width of the device separation film in the core section may be reduced, thereby reducing the area occupied by the core section. Moreover, since the second core section MOS transistor is provided on the semiconductor substrate, the junction capacitance thereof is smaller than that of a conventional MOS transistor which is provided on a well. As a result, a high-speed operation is realized.

It is preferable to have a third well of the second conductivity type provided under a part of the device separation film which is closer to the first core section MOS transistor, wherein an impurity concentration of the third well of the second conductivity type is higher than that of the first well of the second conductivity type. In such a case, the impurity concentration of the second well of the second conductivity type may be substantially equal to that of the third well of the second conductivity type. By providing the third well of the second conductivity type, punch-through resistance under the device separation film is further increased, thereby further reducing the area occupied by the core section.

According to another aspect of the present invention, a method for fabricating a semiconductor device comprises the step of forming a core section complementary transistor and a memory cell section complementary transistor on a semiconductor substrate of a first conductivity type. The forming complementary transistors has forming a first device separation film and a second device separation film on the semiconductor substrate, wherein the first device separation film separates a first core section MOS transistor and a second core section MOS transistor from each other, and the second device separation film separates a first memory cell section MOS transistor and a second memory cell section MOS transistor from each other. The first and second core section MOS transistors constitute the core section complementary transistor. The first and second memory cell section MOS transistors constitute the memory cell section complementary transistor. Each of the first core section MOS transistor and the first memory cell section MOS transistor includes source-drain regions of the first conductivity type. The each of the second core section MOS transistor and the second memory cell section MOS transistor includes source-drain regions of s second conductivity type.

According to the aspect of the present invention, the first well of the first conductivity type and the second well of the first conductivity type are simultaneously formed. As a result, punch-through resistance under the device separation film may be increased without increasing the number of the fabrication steps.

It should be noted that, by implanting the ions of the first conductivity type at a low dose after the ions of the second conductivity type are implanted, the effective impurity concentration of the well in the first core section MOS transistor is reduced, thereby reducing the junction capacitance thereof. As a result, a high-speed operation is realized.

BRIEF DESCRIPTION OF THE DRAWINGS

In the accompanying drawings:

FIG. 1A and FIG. 1B are cross-sectional views each illustrating punch-through occurring under a device separation region in a conventional CMOS transistor;

Figure 15A:
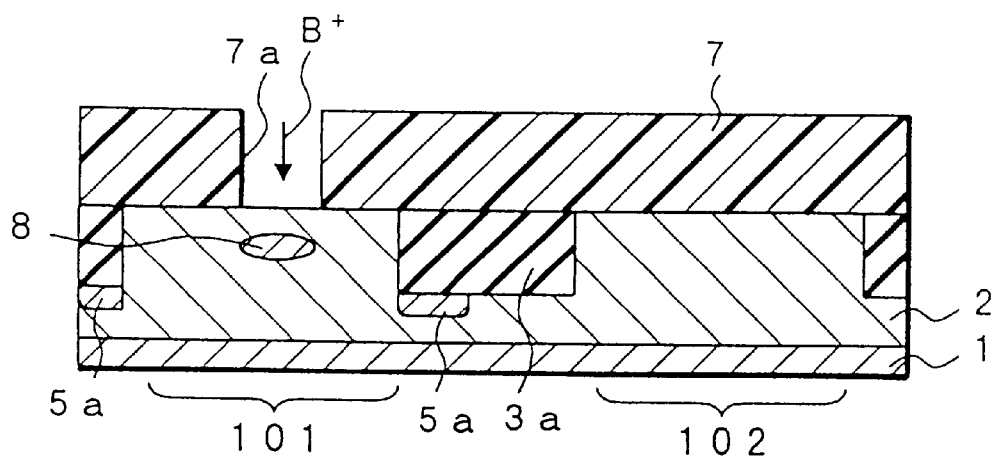
FIG. 15A and FIG. 15B are cross-sectional views each illustrating the next step following the step shown in FIG. 14A and FIG. 14B in the method for fabricating a semiconductor device according to the first embodiment of the present invention.
Figure 15B:
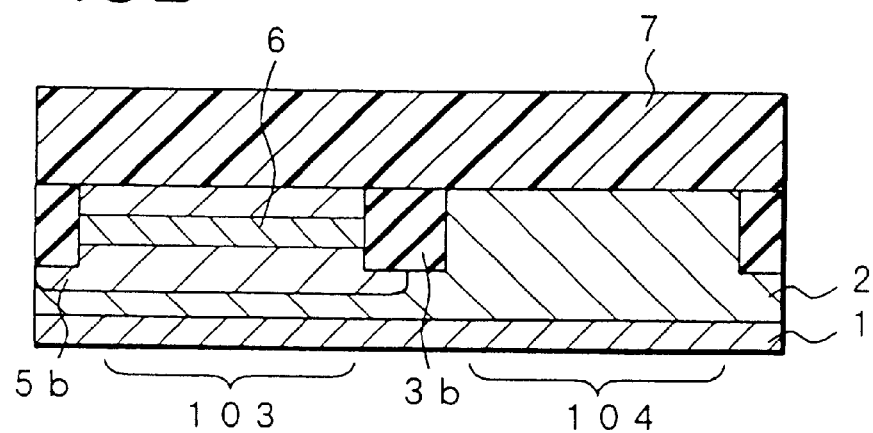
Figure 16A:
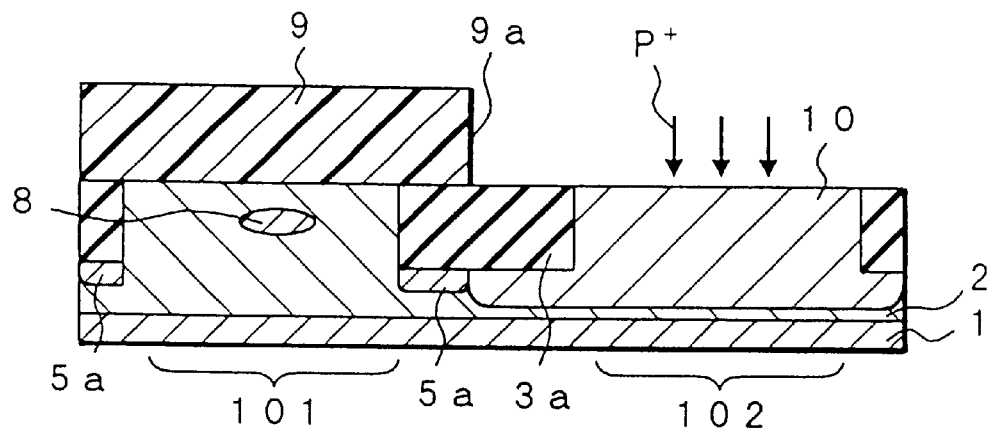
FIG. 16A and FIG. 16B are cross-sectional views each illustrating the next step following the step shown in FIG.
Figure 16B:
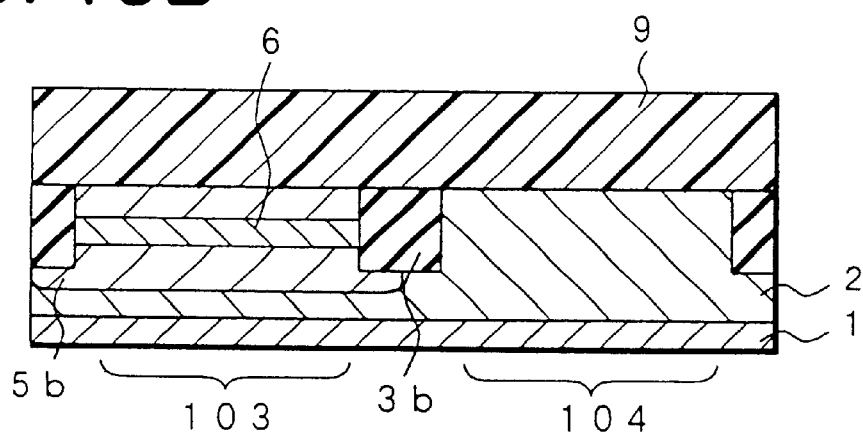
Figure 17A:
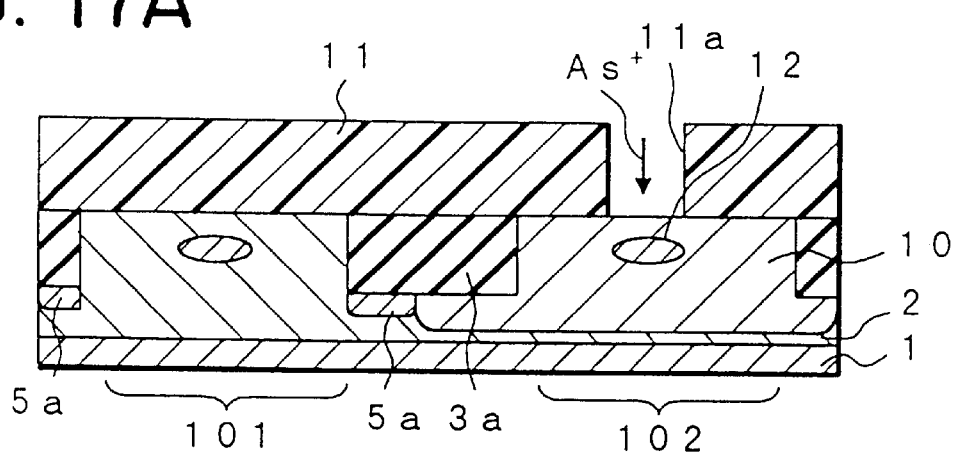
Figure 17B:
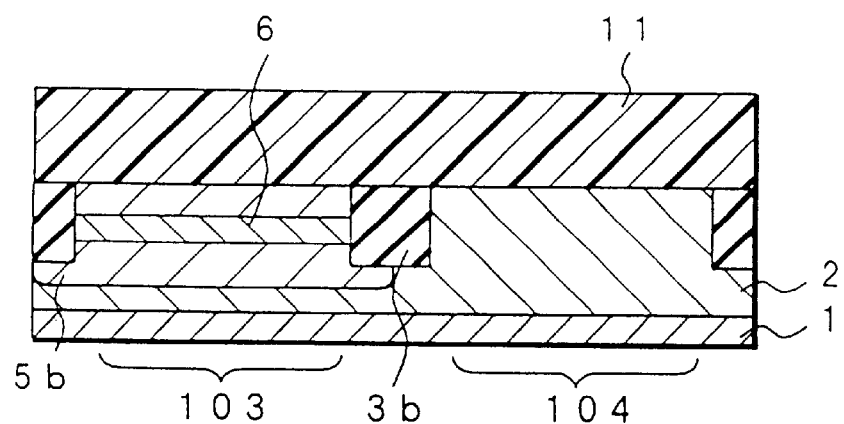
Figure 18A:
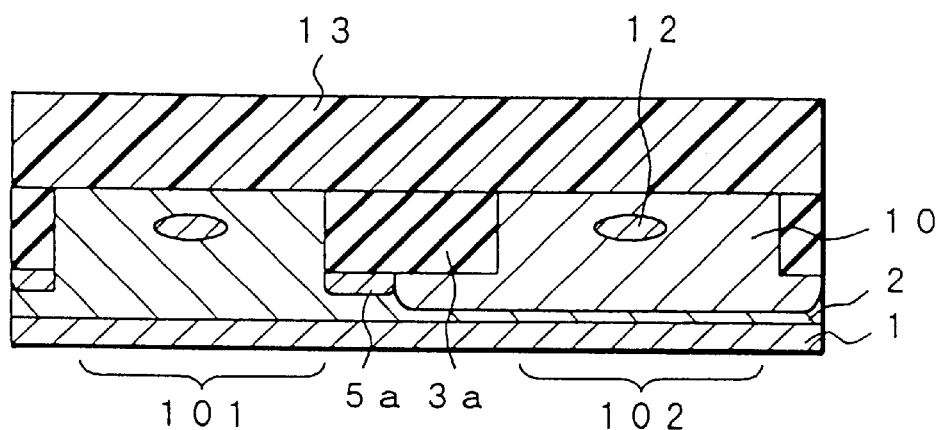
Figure 18B:
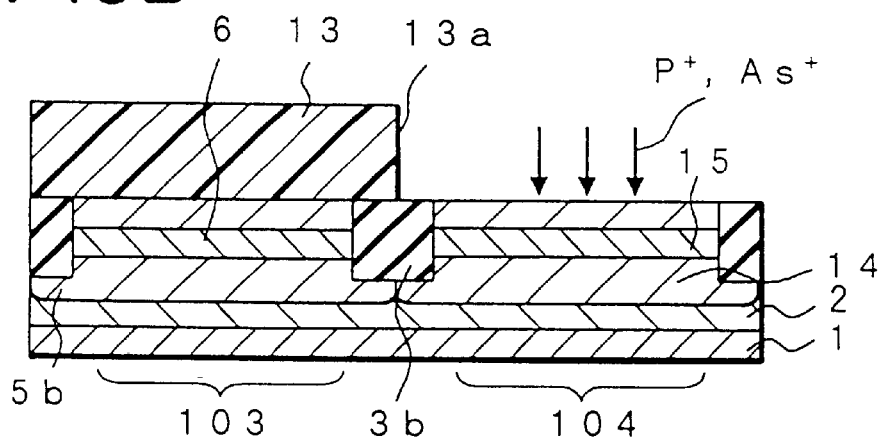
Figure 19A:
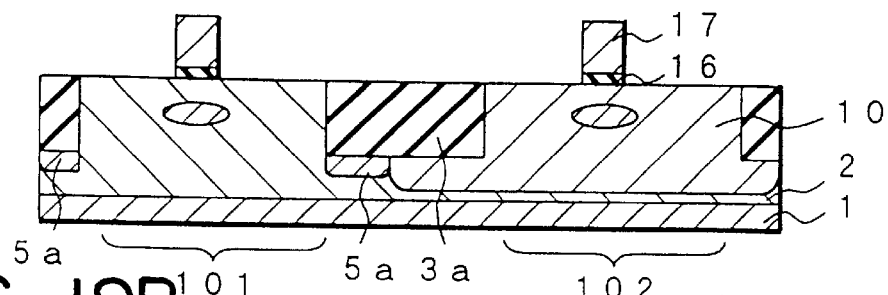
Figure 19B:
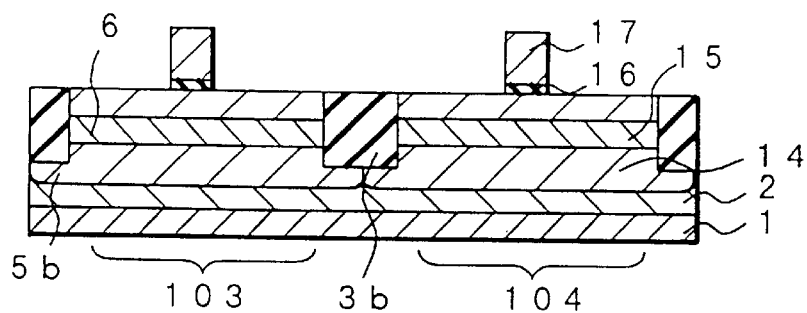
Figure 20A:
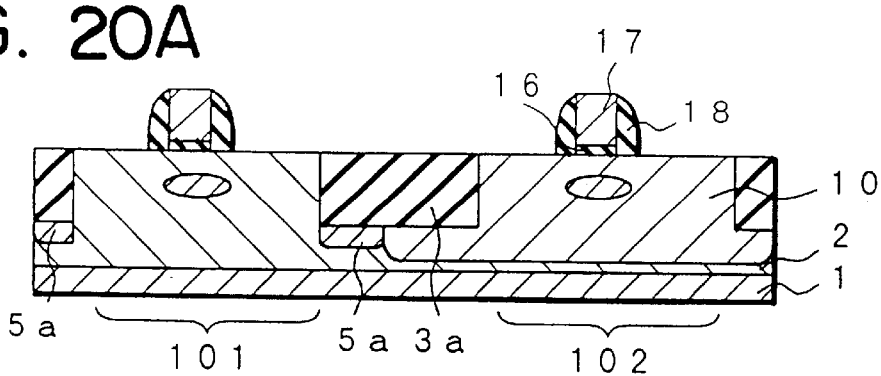
Figure 20B:
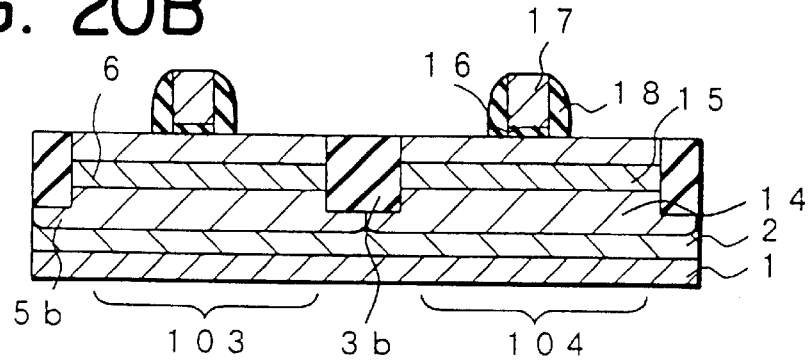
Figure 21A:
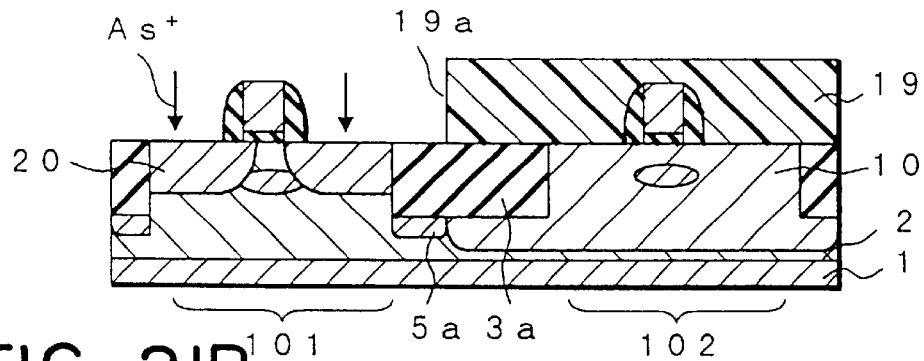
Figure 21B:
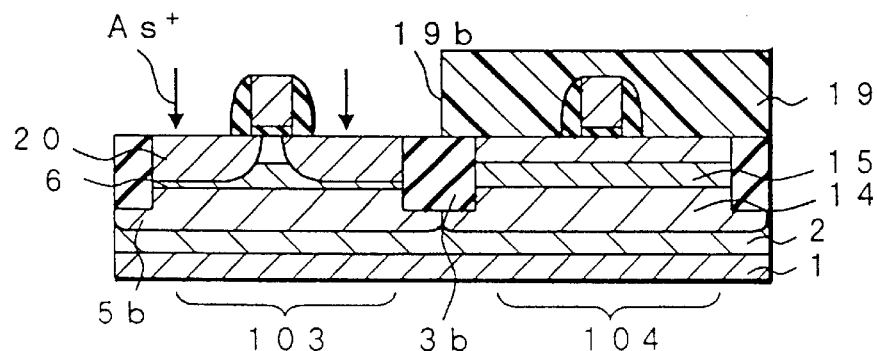
Figure 22A:
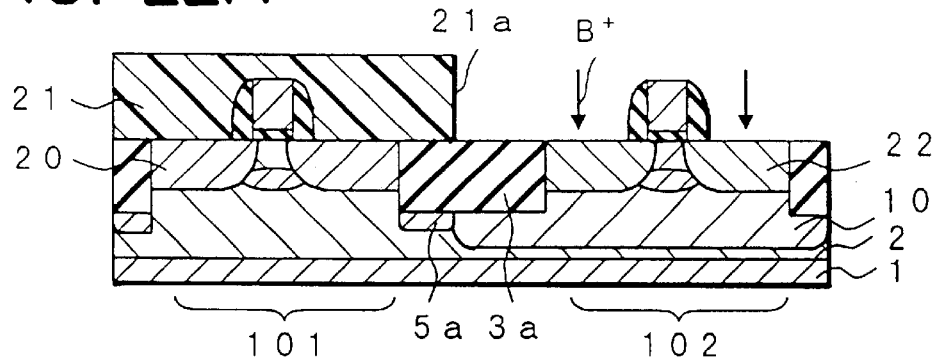
Figure 22B:
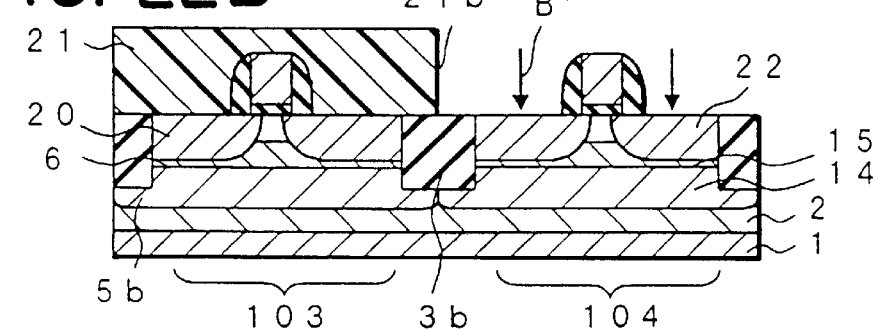
Figure 23A:
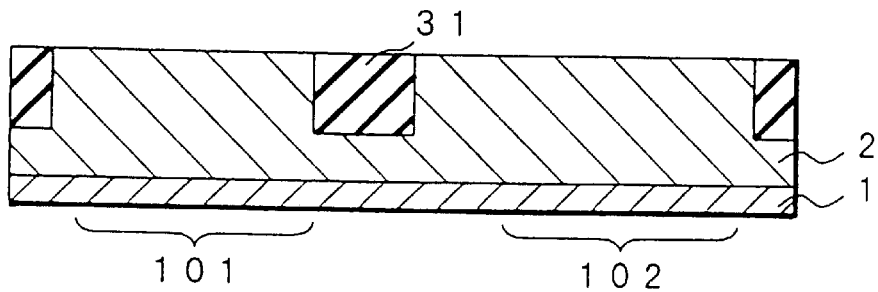
Figure 23B:
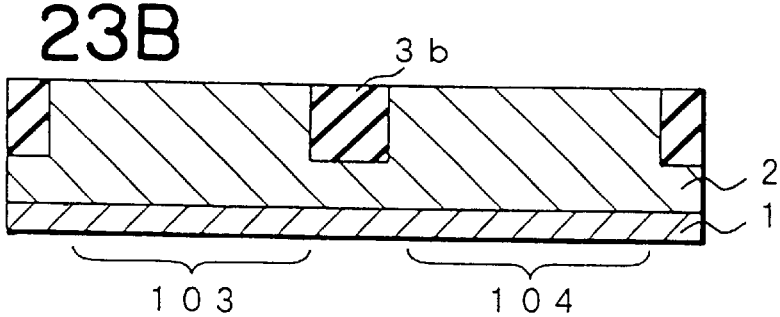
Figure 24A:
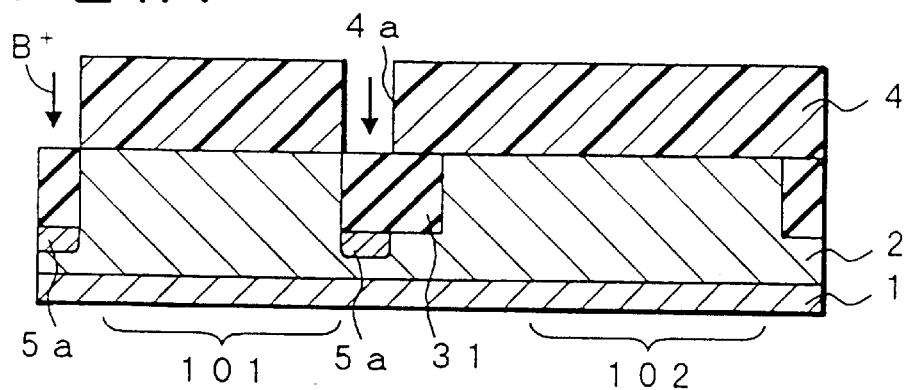
Figure 24B:
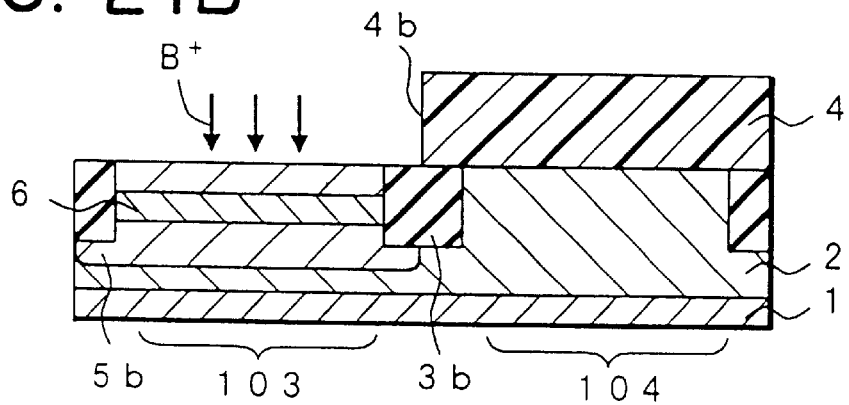
Figure 25A:
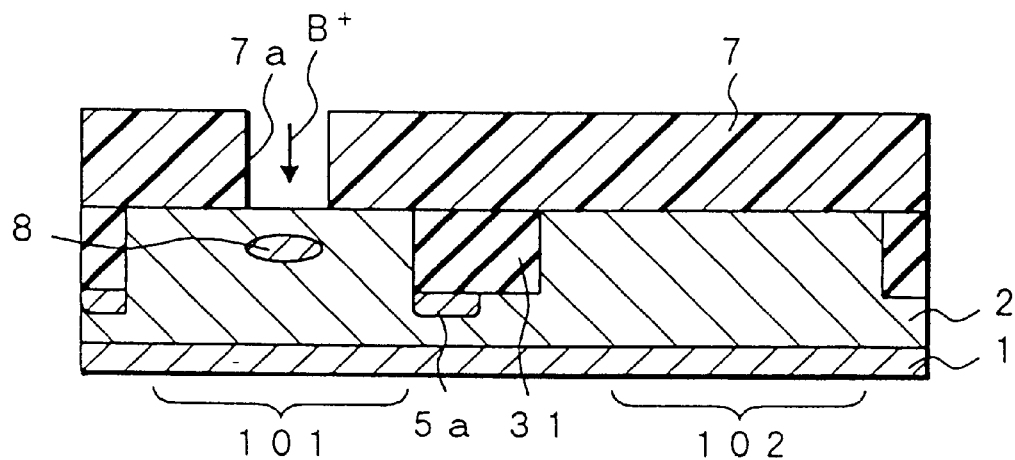
Figure 25B:
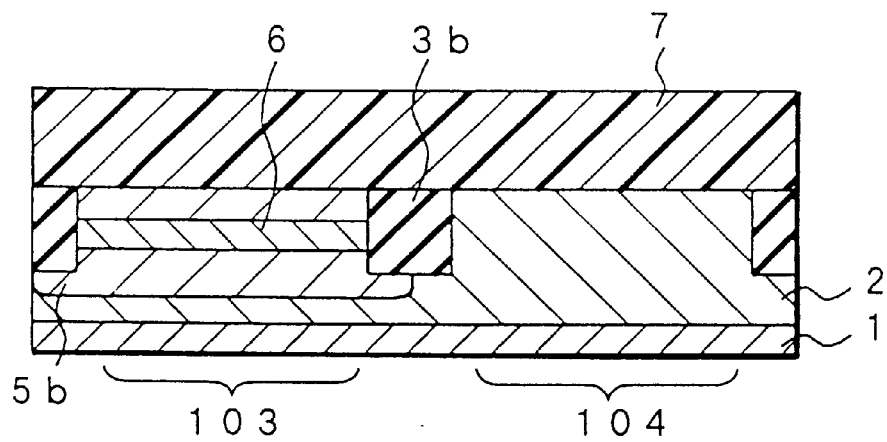
Figure 26A:
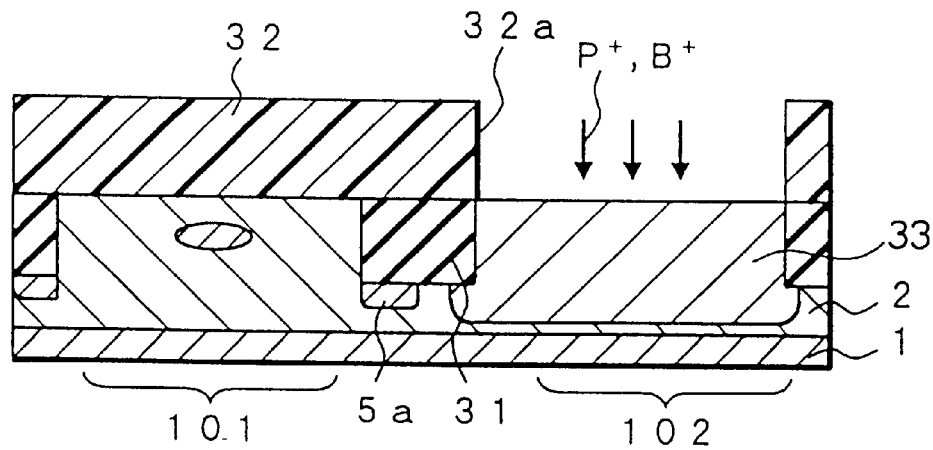
Figure 26B:
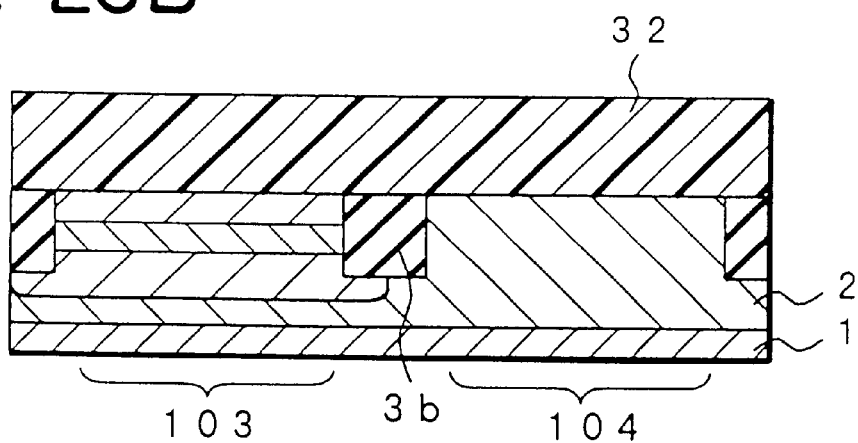
Figure 27A:
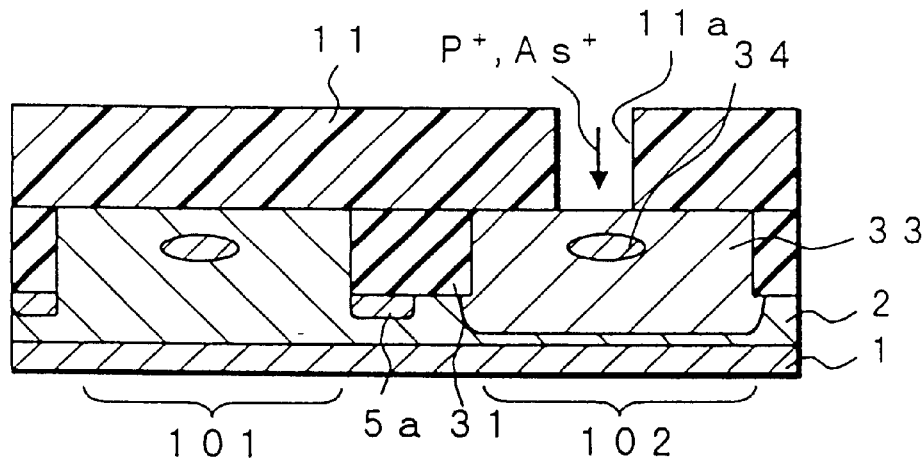
Figure 27B:
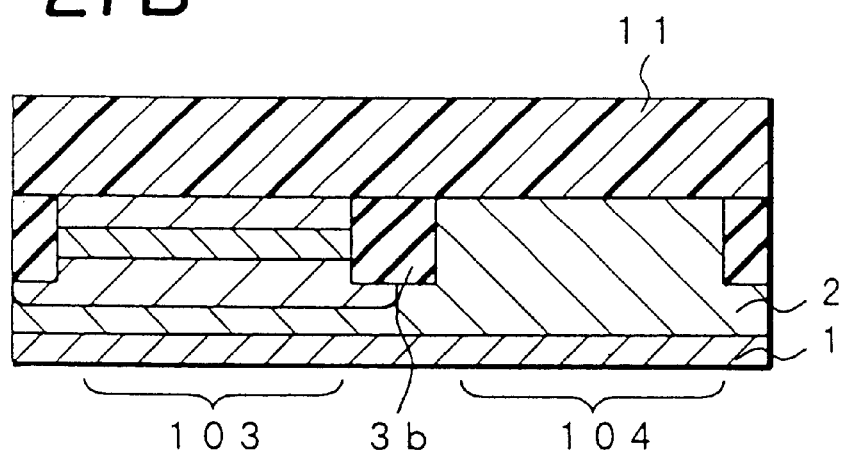
Figure 28A:
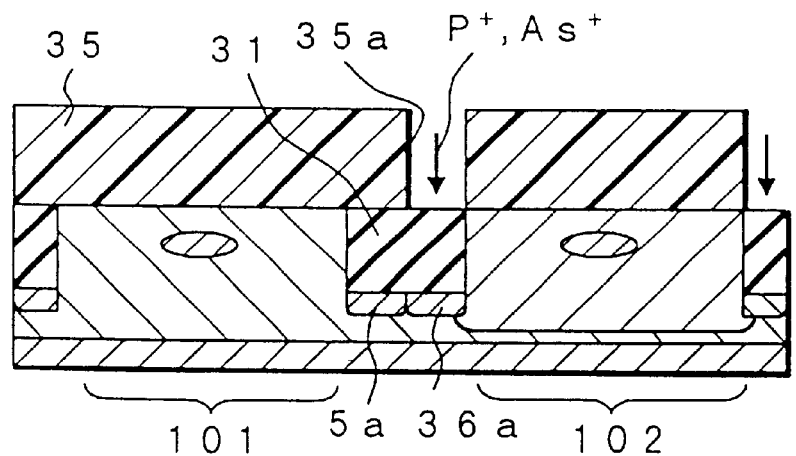
Figure 28B:
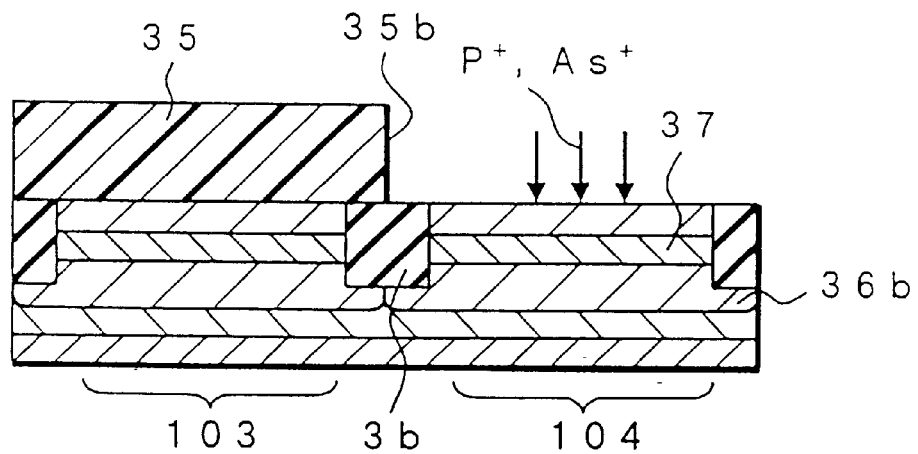
Figure 29A:
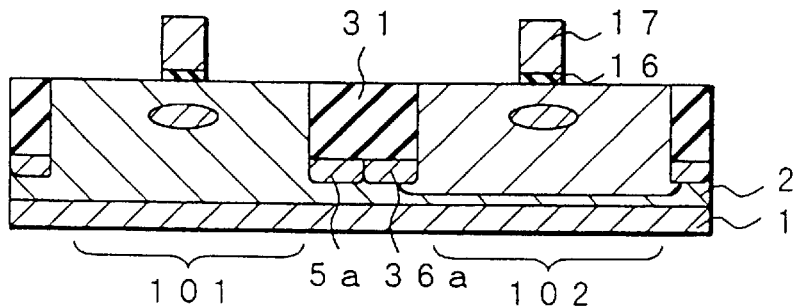
Figure 29B:
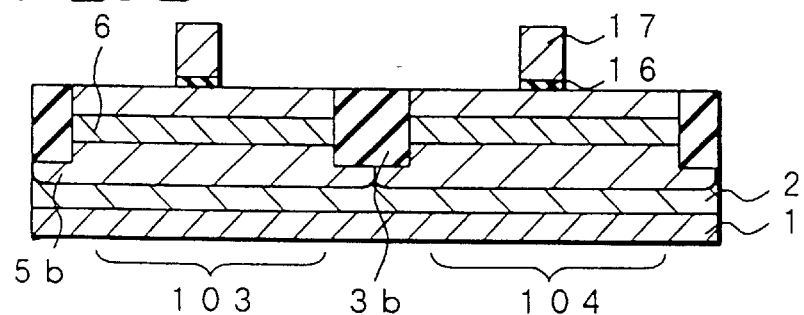
Figure 30A:
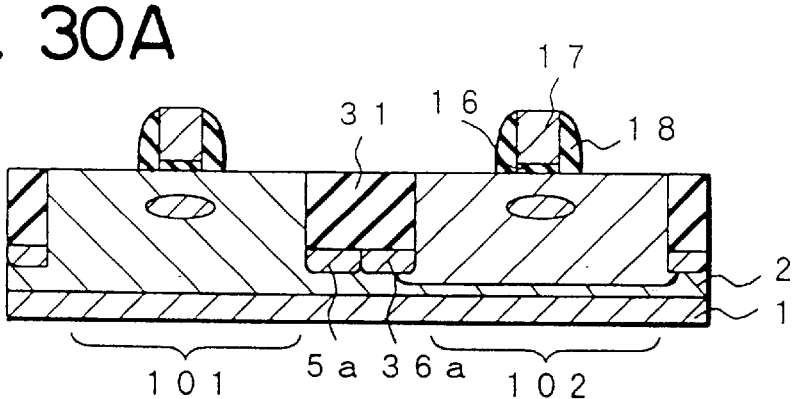
Figure 30B:
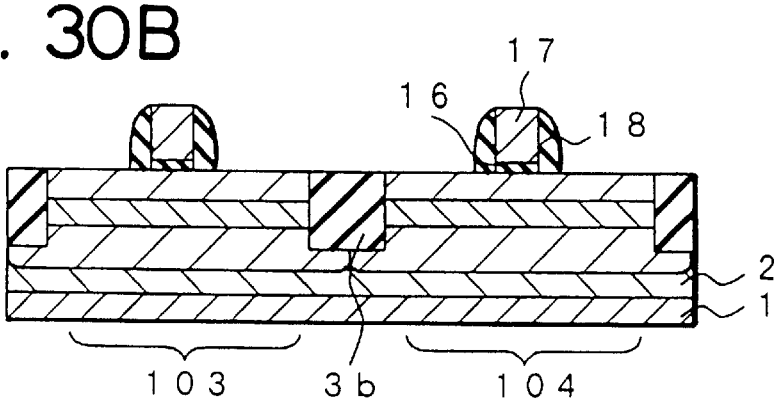
Figure 31A:
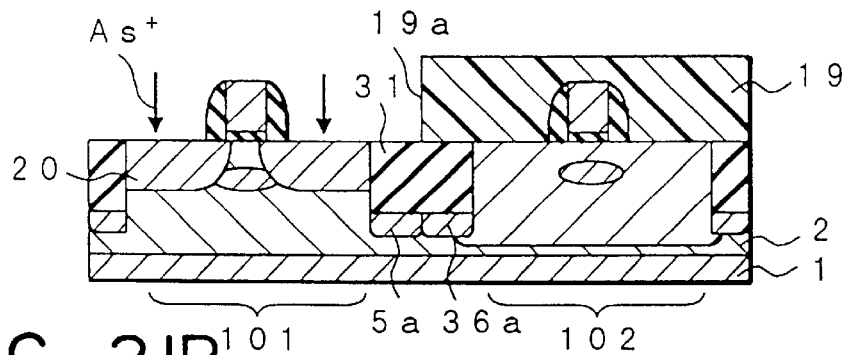
Figure 31B:
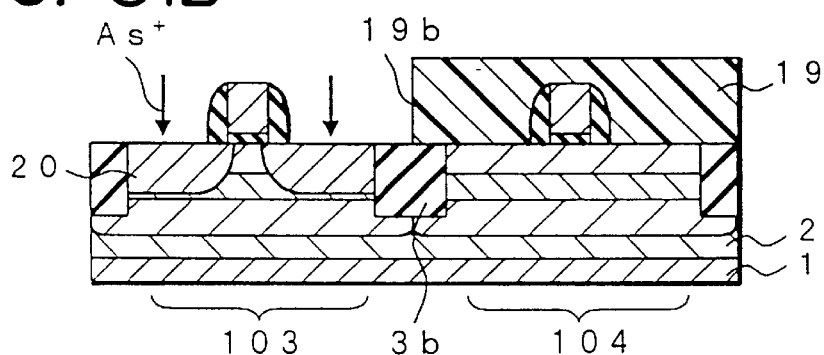
Figure 32A:
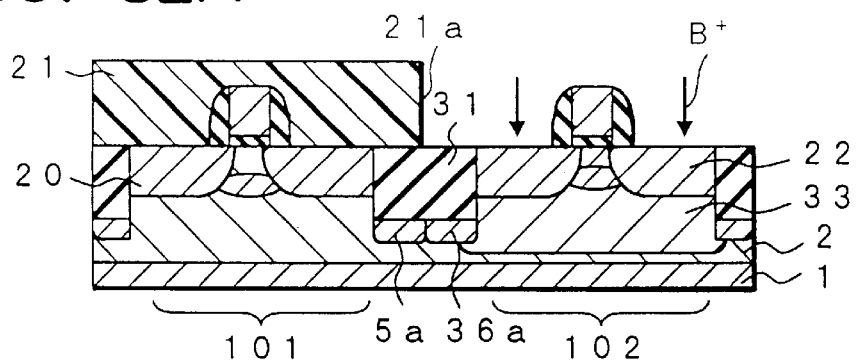
Figure 32B:
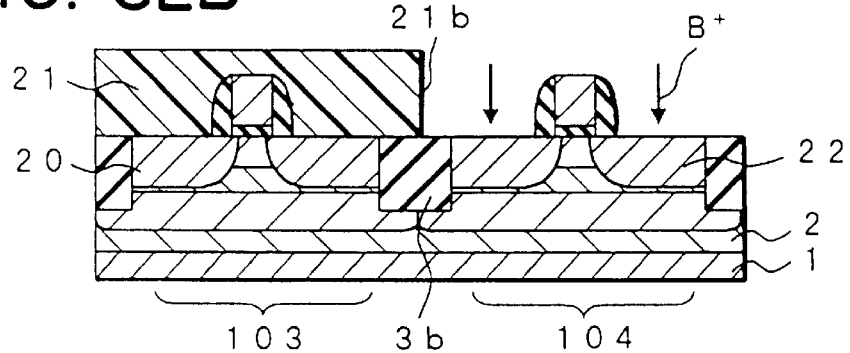
Figure 33A:
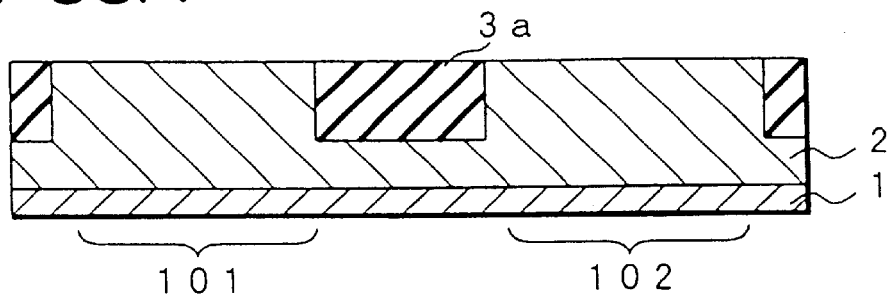
Figure 33B:
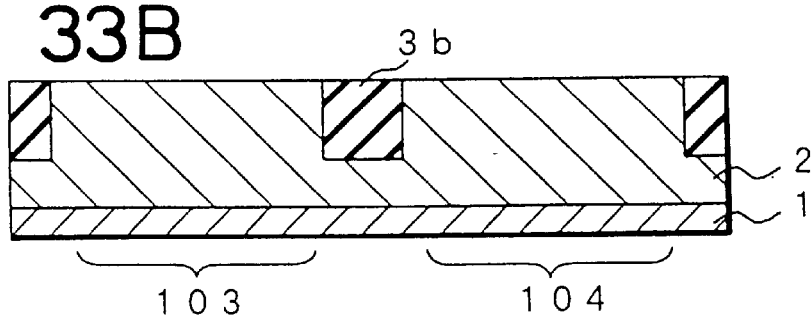
Figure 34A:
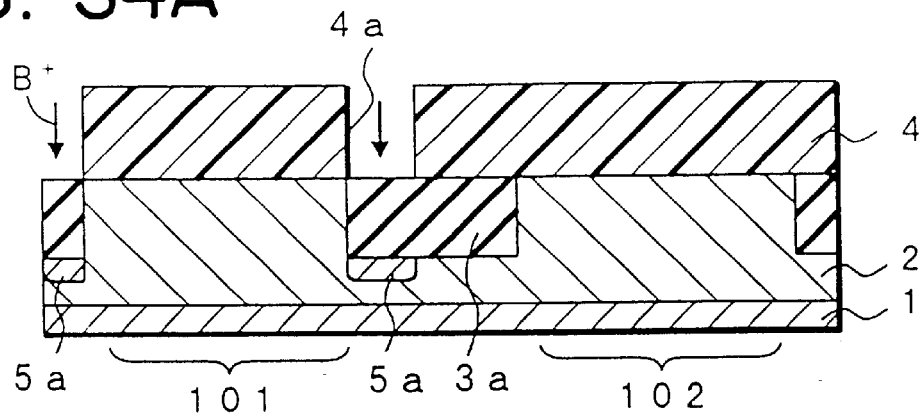
Figure 34B:
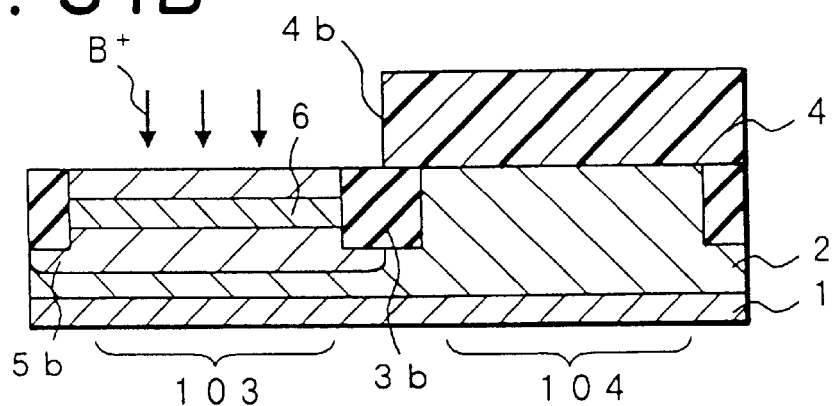
Figure 35A:
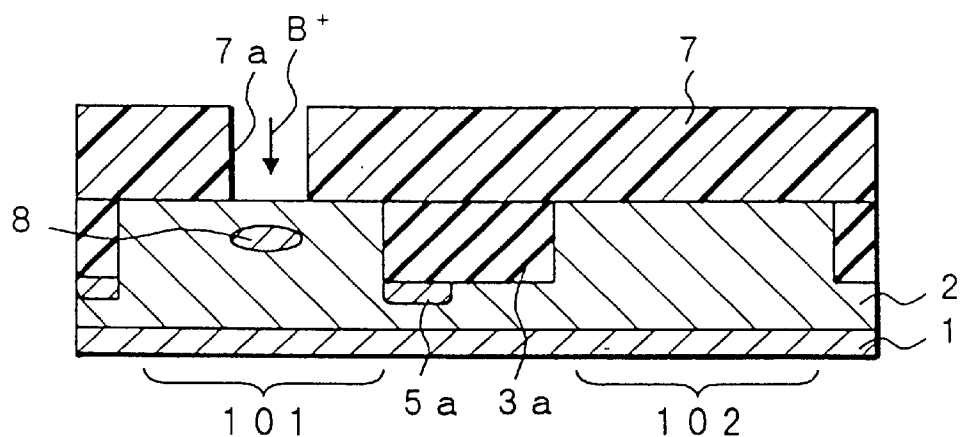
Figure 35B:
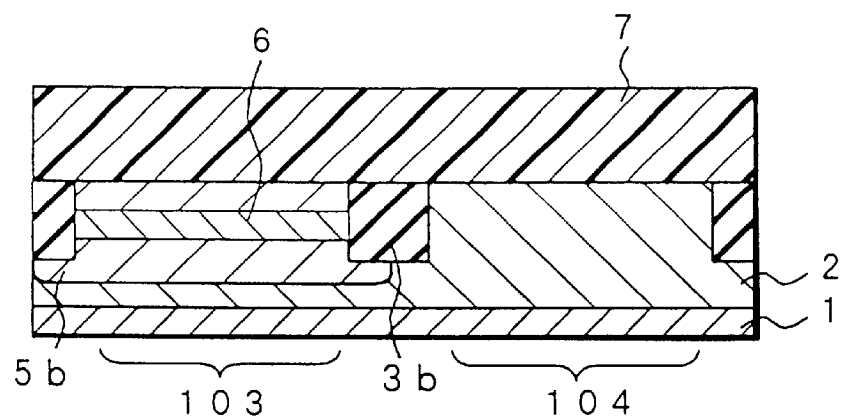
Figure 36A:
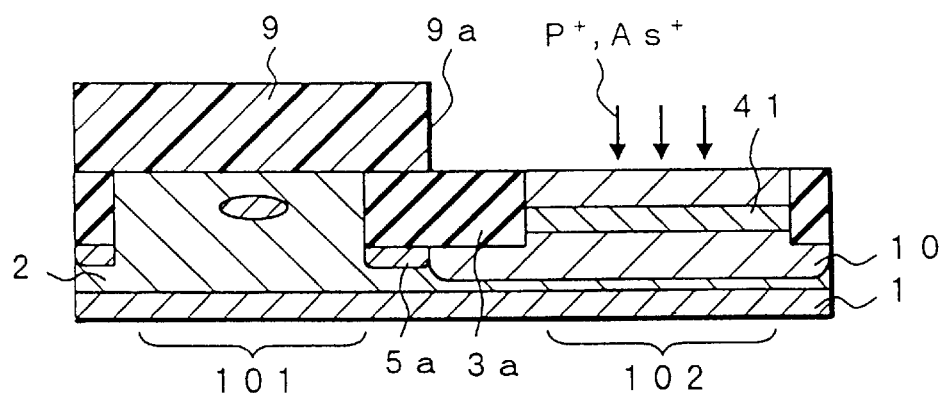
Figure 36B:
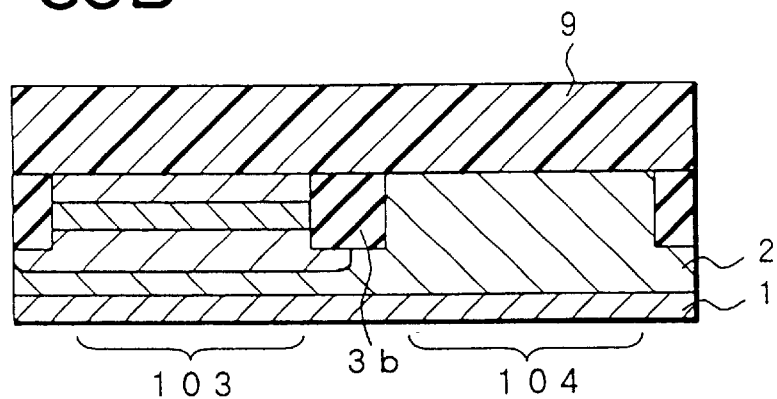
Figure 37A:
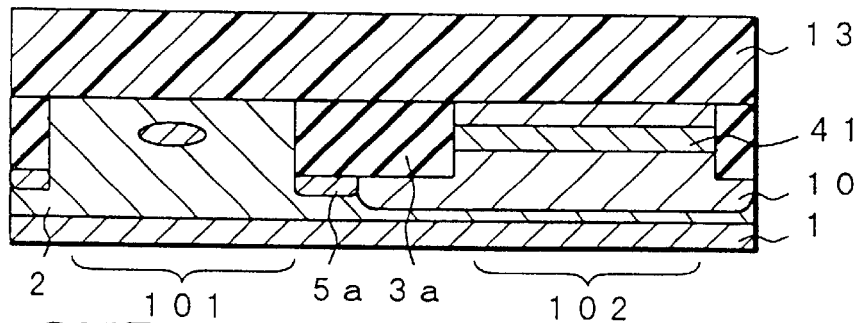
Figure 37B:
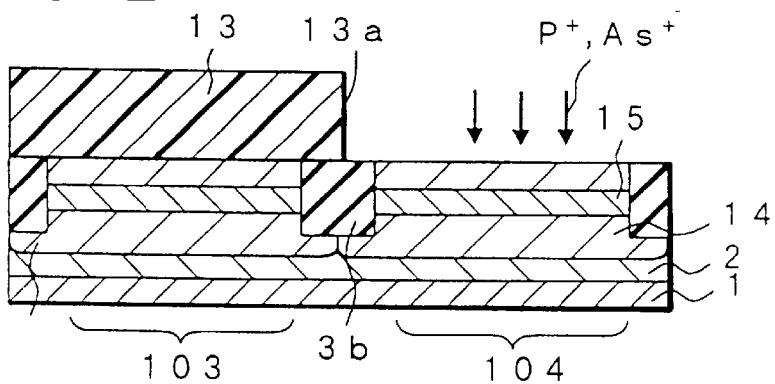
Figure 38A:
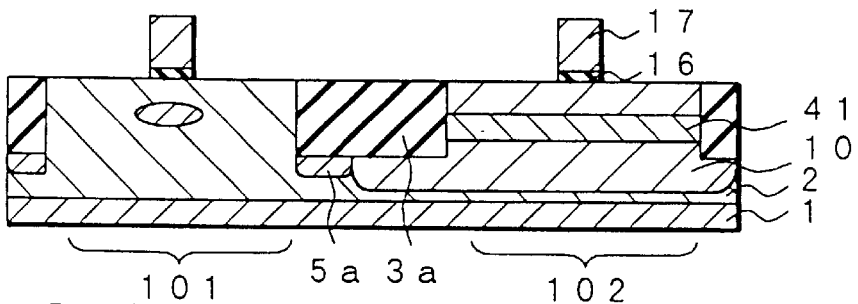
Figure 38B:
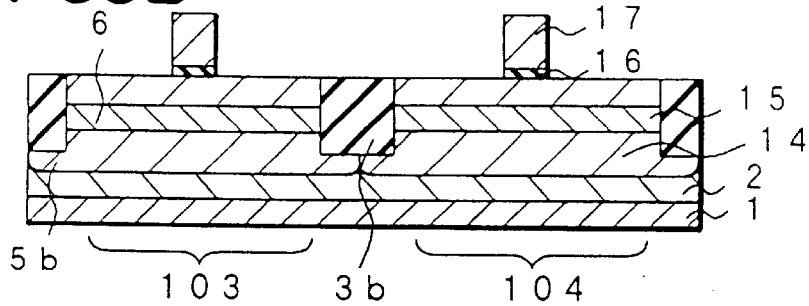
Figure 39A:
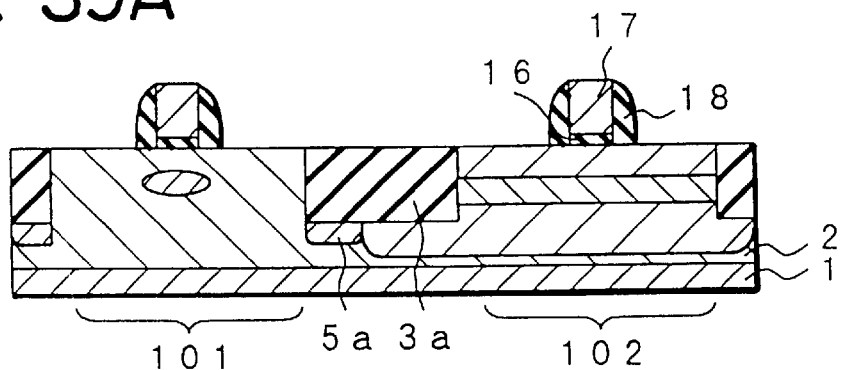
Figure 39B:
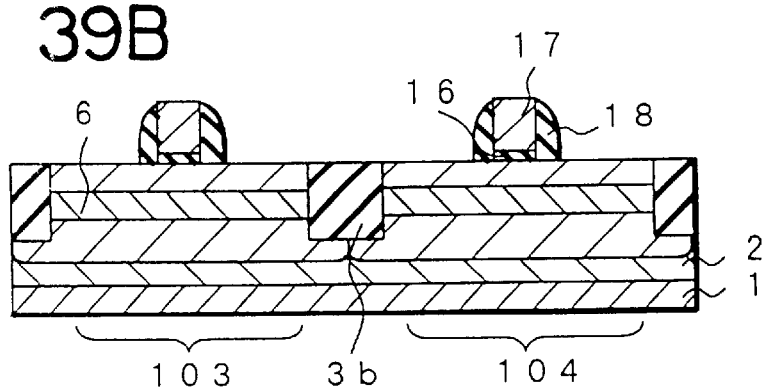
Figure 40A:
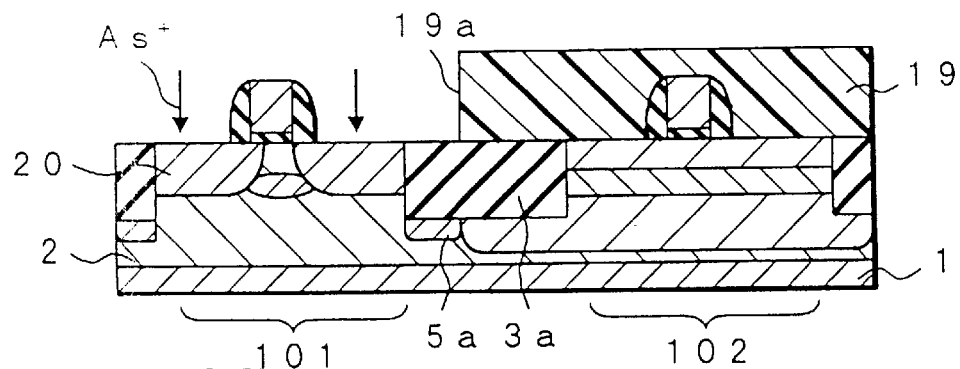
Figure 40B:
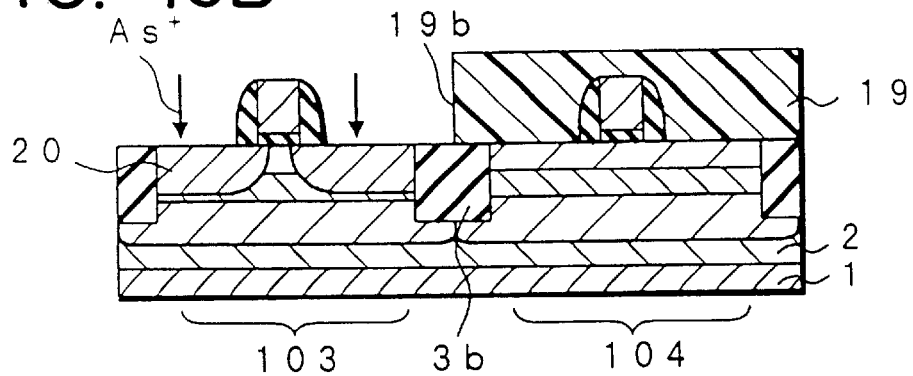
Figure 41A:
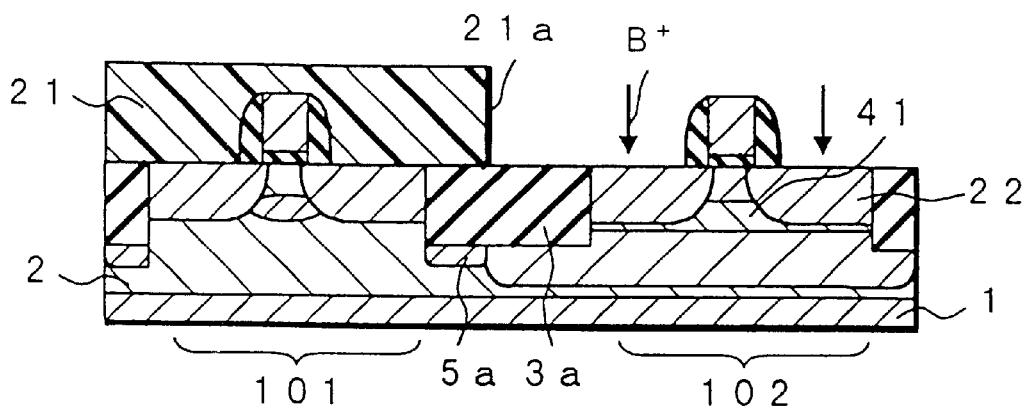
Figure 41B:
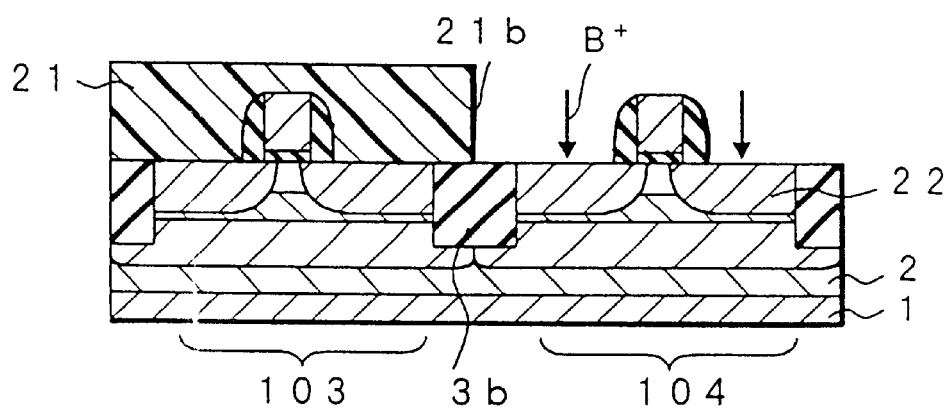
Figure 42A:
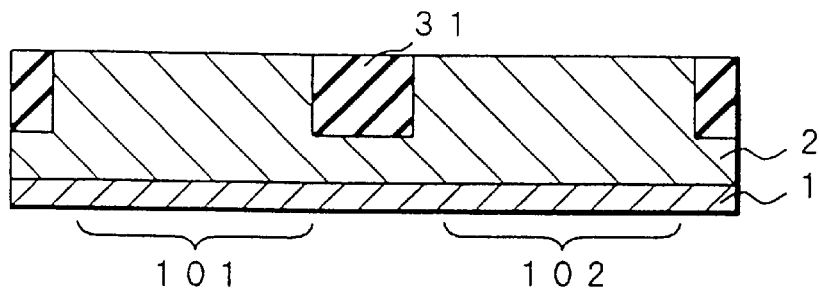
Figure 42B:
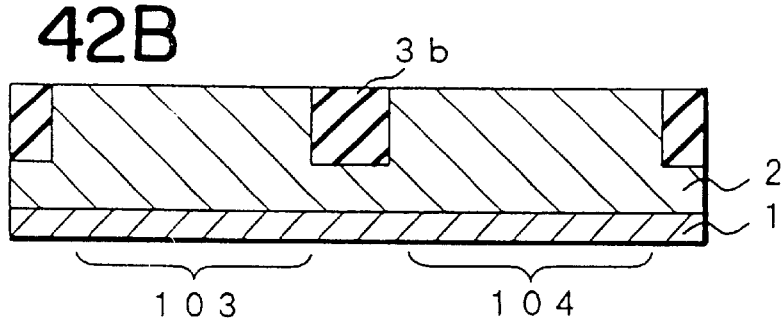
Figure 43A:
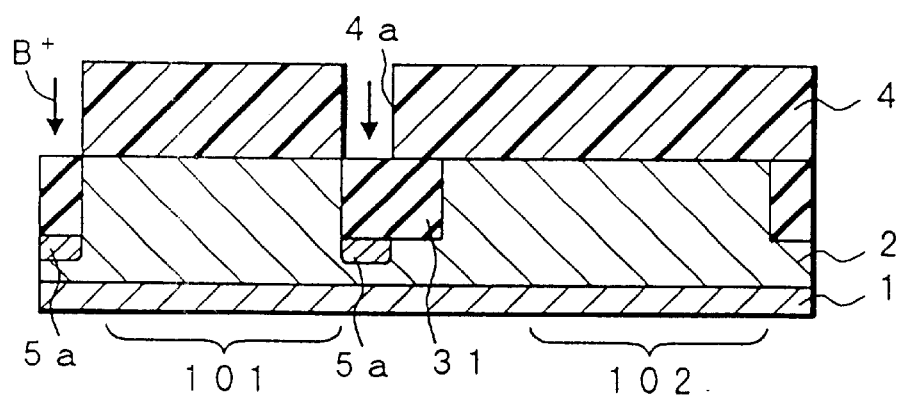
Figure 43B:
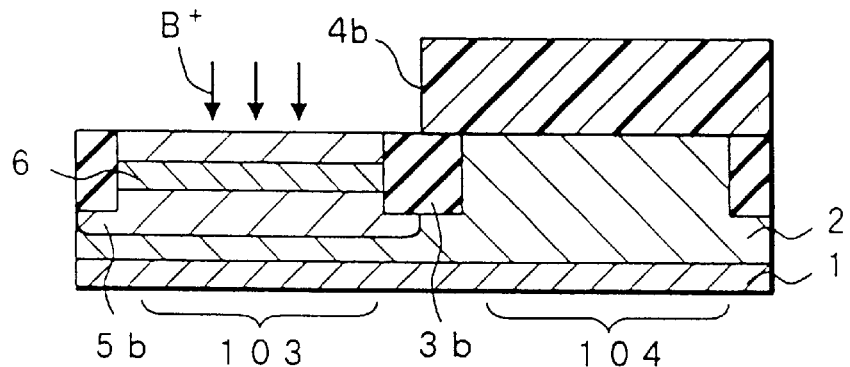
Figure 44A:
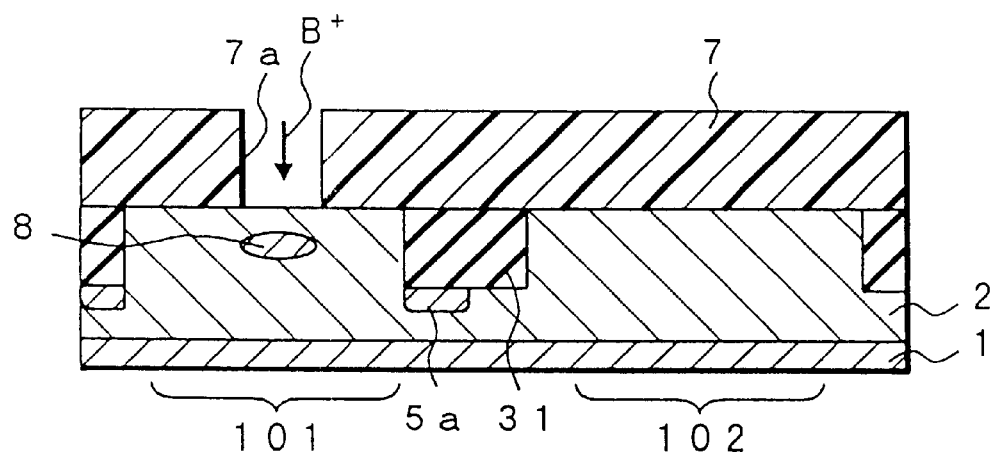
Figure 44B:
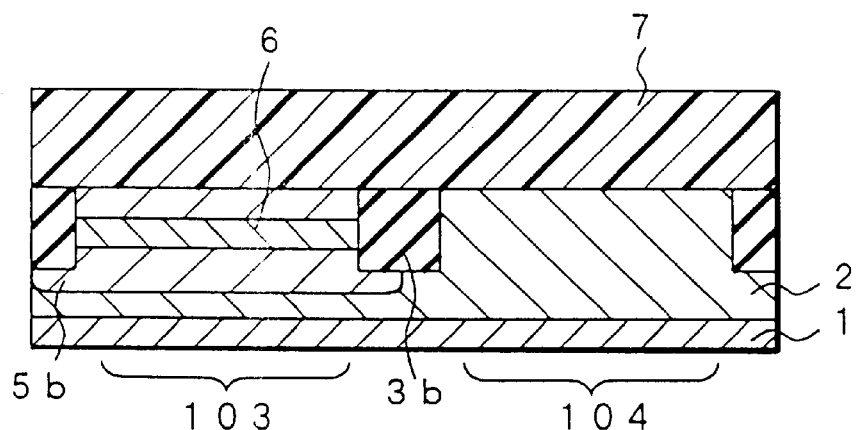
Figure 45A:
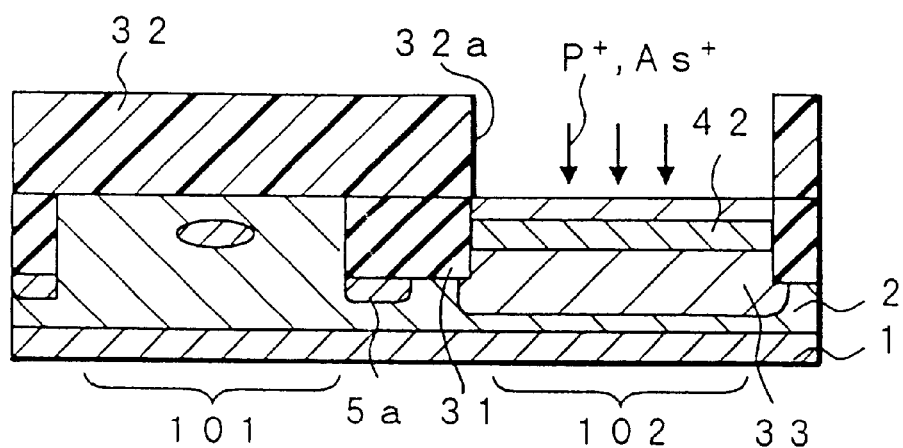
Figure 45B:
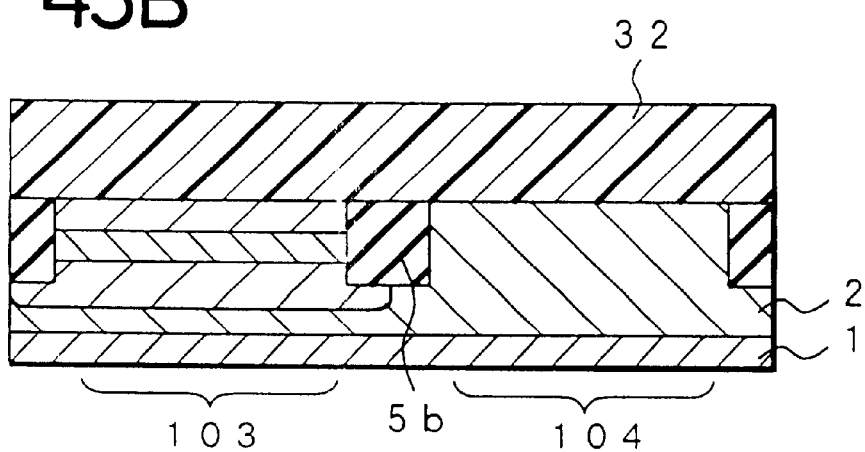
Figure 46A:
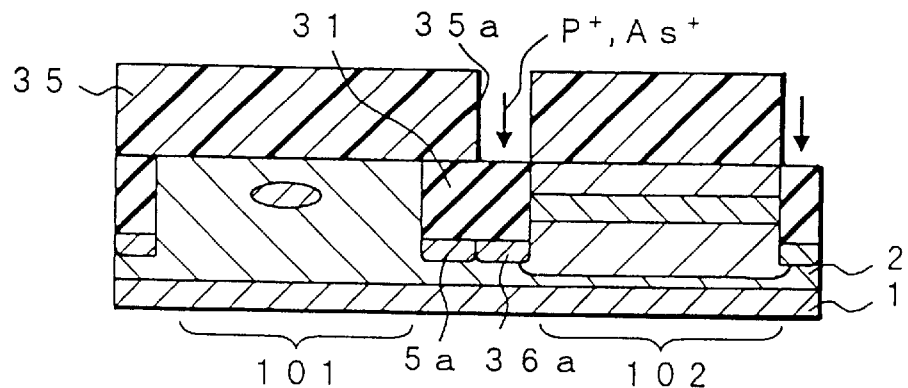
Figure 46B:
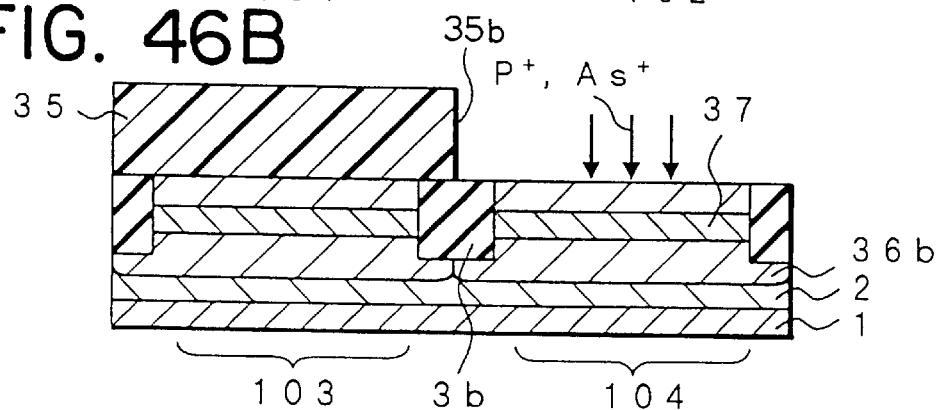
Figure 47A:
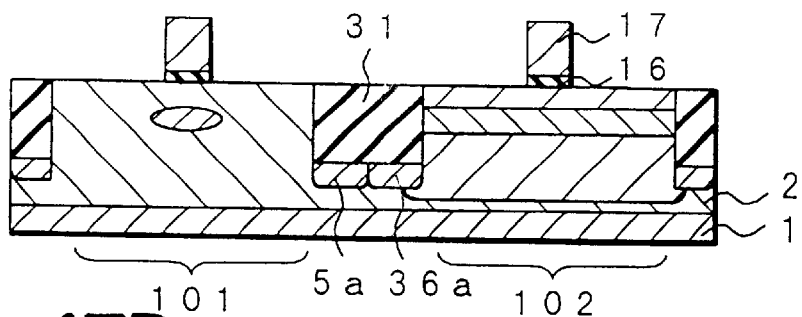
Figure 47B:
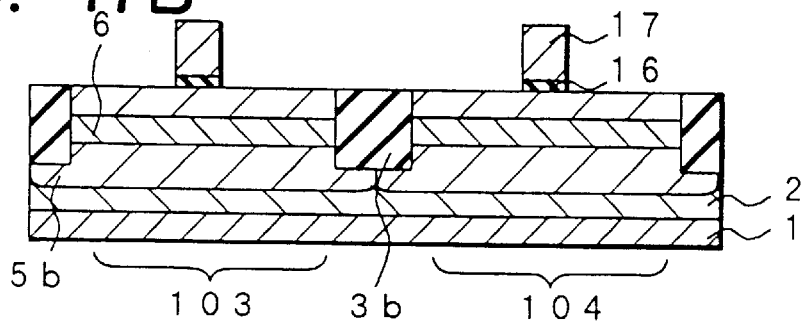
Figure 48A:
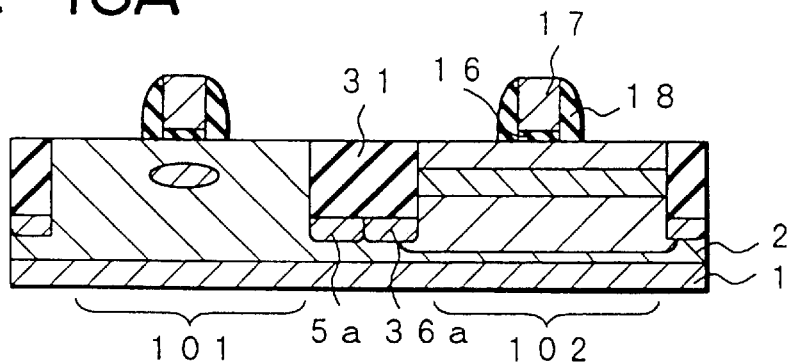
Figure 48B:
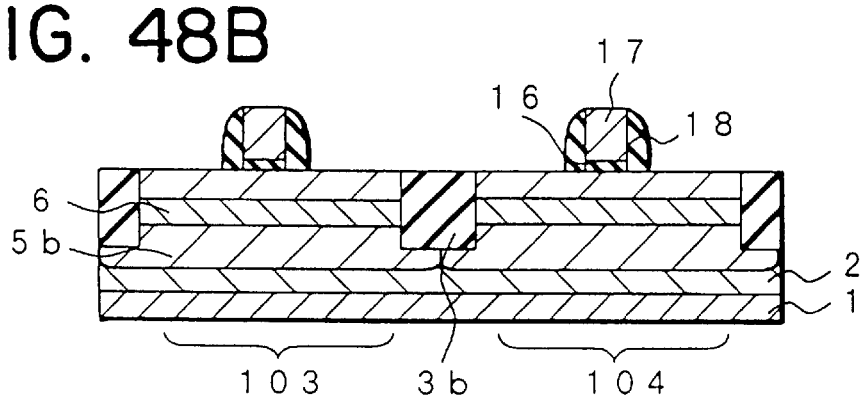
Figure 49A:
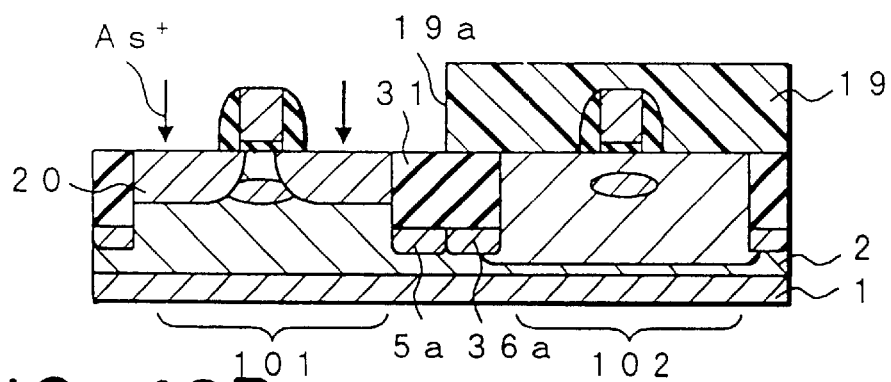
Figure 49B:
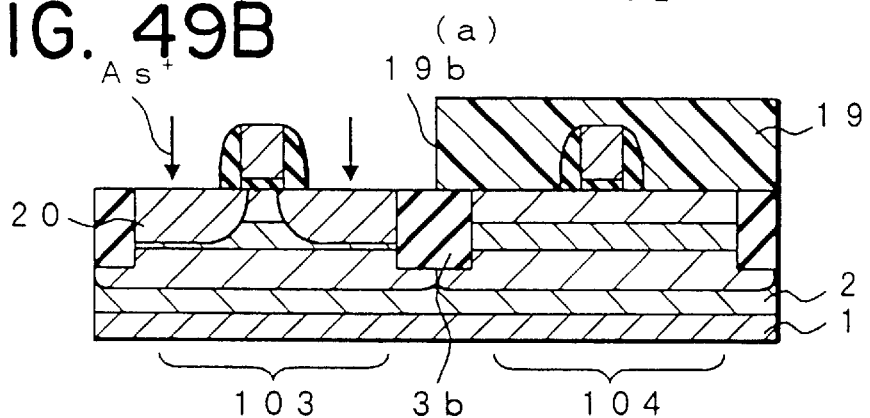
Figure 50A:
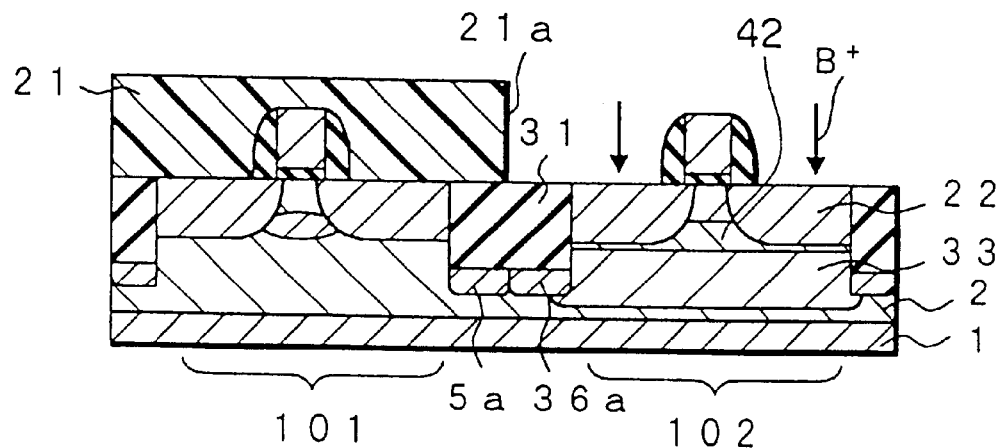
Figure 50B:
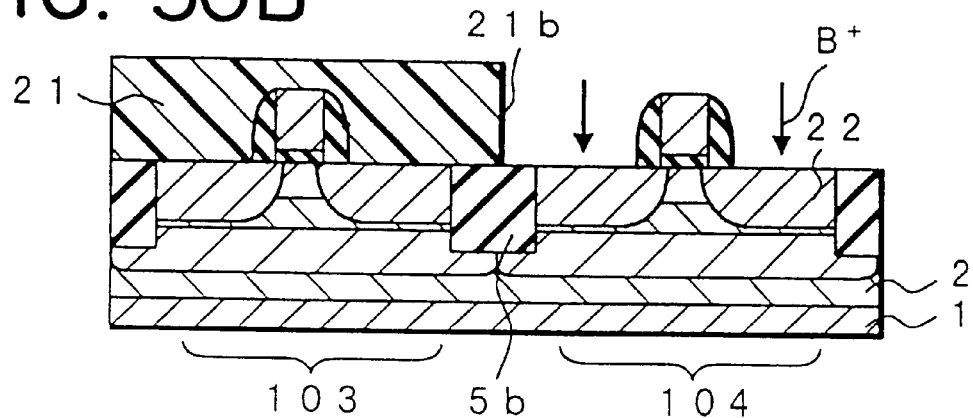

15A and FIG. 15B in the method for fabricating a semiconductor device according to the first embodiment of the present invention;

FIG. 17A and FIG. 17B are cross-sectional views each illustrating the next step following the step shown in FIG. 16A and FIG. 16B in the method for fabricating a semiconductor device according to the first embodiment of the present invention;

FIG. 18A and FIG. 18B are cross-sectional views each illustrating the next step following the step shown in FIG. 17A and FIG. 17B in the method for fabricating a semiconductor device according to the first embodiment of the present invention;

FIG. 19A and FIG. 19B are cross-sectional views each illustrating the next step following the step shown in FIG. 18A and FIG. 18B in the method for fabricating a semiconductor device according to the first embodiment of the present invention;

FIG. 20A and FIG. 20B are cross-sectional views each illustrating the next step following the step shown in FIG. 19A and FIG. 19B in the method for fabricating a semiconductor device according to the first embodiment of the present invention;

FIG. 21A and FIG. 21B are cross-sectional views each illustrating the next step following the step shown in FIG. 20A and FIG. 20B in the method for fabricating a semiconductor device according to the first embodiment of the present invention;

FIG. 22A and FIG. 22B are cross-sectional views each illustrating the next step following the step shown in FIG. 21A and FIG. 21B in the method for fabricating a semiconductor device according to the first embodiment of the present invention;

FIG. 23A and FIG. 23B are cross-sectional views each illustrating a step in a method for fabricating a semiconductor device according to a second embodiment of the present invention;

FIG. 24A and FIG. 24B are cross-sectional views each illustrating the next step following the step shown in FIG. 23A and FIG. 23B in the method for fabricating a semiconductor device according to the second embodiment of the present invention;

FIG. 25A and FIG. 25B are cross-sectional views each illustrating the next step following the step shown in FIG. 24A and FIG. 24B in the method for fabricating a semiconductor device according to the second embodiment of the present invention;

FIG. 26A and FIG. 26B are cross-sectional views each illustrating the next step following the step shown in FIG. 25A and FIG. 25B in the method for fabricating a semiconductor device according to the second embodiment of the present invention;

FIG. 27A and FIG. 27B are cross-sectional views each illustrating the next step following the step shown in FIG. 26A and FIG. 26B in the method for fabricating a semiconductor device according to the second embodiment of the present invention;

FIG. 28A and FIG. 28B are cross-sectional views each illustrating the next step following the step shown in FIG. 27A and FIG. 27B in the method for fabricating a semiconductor device according to the second embodiment of the present invention;

FIG. 29A and FIG. 29B are cross-sectional views each illustrating the next step following the step shown in FIG. 28A and FIG. 28B in the method for fabricating a semiconductor device according to the second embodiment of the present invention;

FIG. 30A and FIG. 30B are cross-sectional views each illustrating the next step following the step shown in FIG. 29A and FIG. 29B in the method for fabricating a semiconductor device according to the second embodiment of the present invention;

FIG. 31A and FIG. 31B are cross-sectional views each illustrating the next step following the step shown in FIG. 30A and FIG. 30B in the method for fabricating a semiconductor device according to the second embodiment of the present invention;

FIG. 32A and FIG. 32B are cross-sectional views each illustrating the next step following the step shown in FIG. 31A and FIG. 31B in the method for fabricating a semiconductor device according to the second embodiment of the present invention;

FIG. 33A and FIG. 33B are cross-sectional views each illustrating a step in a method for fabricating a semiconductor device according to a third embodiment of the present invention;

FIG. 34A and FIG. 34B are cross-sectional views each illustrating the next step following the step shown in FIG. 33A and FIG. 33B in the method for fabricating a semiconductor device according to the third embodiment of the present invention;

FIG. 35A and FIG. 35B are cross-sectional views each illustrating the next step following the step shown in FIG. 34A and FIG. 34B in the method for fabricating a semiconductor device according to the third embodiment of the present invention;

FIG. 36A and FIG. 36B are cross-sectional views each illustrating the next step following the step shown in FIG. 35A and FIG. 35B in the method for fabricating a semiconductor device according to the third embodiment of the present invention;

FIG. 37A and FIG. 37B are cross-sectional views each illustrating the next step following the step shown in FIG. 36A and FIG. 36B in the method for fabricating a semiconductor device according to the third embodiment of the present invention;

FIG. 38A and FIG. 38B are cross-sectional views each illustrating the next step following the step shown in FIG. 37A and FIG. 37B in the method for fabricating a semiconductor device according to the third embodiment of the present invention;

FIG. 39A and FIG. 39B are cross-sectional views each illustrating the next step following the step shown in FIG. 38A and FIG. 38B in the method for fabricating a semiconductor device according to the third embodiment of the present invention;

FIG. 40A and FIG. 40B are cross-sectional views each illustrating the next step following the step shown in FIG. 39A and FIG. 39B in the method for fabricating a semiconductor device according to the third embodiment of the present invention;

FIG. 41A and FIG. 41B are cross-sectional views each illustrating the next step following the step shown in FIG. 40A and FIG. 40B in the method for fabricating a semiconductor device according to the third embodiment of the present invention;

FIG. 42A and FIG. 42B are cross-sectional views each illustrating a step in a method for fabricating a semiconductor device according to a fourth embodiment of the present invention;

FIG. 43A and FIG. 43B are cross-sectional views each illustrating the next step following the step shown in FIG. 42A and FIG. 42B in the method for fabricating a semiconductor device according to the fourth embodiment of the present invention;

FIG. 44A and FIG. 44B are cross-sectional views each illustrating the next step following the step shown in FIG. 43A and FIG. 43B in the method for fabricating a semiconductor device according to the fourth embodiment of the present invention;

FIG. 45A and FIG. 45B are cross-sectional views each illustrating the next step following the step shown in FIG. 44A and FIG. 44B in the method for fabricating a semiconductor device according to the fourth embodiment of the present invention;

FIG. 46A and FIG. 46B are cross-sectional views each illustrating the next step following the step shown in FIG. 45A and FIG. 45B in the method for fabricating a semiconductor device according to the fourth embodiment of the present invention;

FIG. 47A and FIG. 47B are cross-sectional views each illustrating the next step following the step shown in FIG. 46A and FIG. 46B in the method for fabricating a semiconductor device according to the fourth embodiment of the present invention;

FIG. 48A and FIG. 48B are cross-sectional views each illustrating the next step following the step shown in FIG. 47A and FIG. 47B in the method for fabricating a semiconductor device according to the fourth embodiment of the present invention;

FIG. 49A and FIG. 49B are cross-sectional views each illustrating the next step following the step shown in FIG. 48A and FIG. 48B in the method for fabricating a semiconductor device according to the fourth embodiment of the present invention; and FIG. 50A and FIG. 50B are cross-sectional views each illustrating the next step following the step shown in FIG. 49A and FIG. 49B in the method for fabricating a semiconductor device according to the fourth embodiment of the present invention.

DETAILED DESCRIPTION OF THE PREFERRED EMBODIMENT

Methods for fabricating a semiconductor device according to embodiments of the present invention will now be described specifically with reference to the accompanying drawings. In the following description, a well contact layer provided in a CMOS transistor is the one same as the conventional well contact layer. Therefore, the graphic representation of the well contact layer and the description thereof will be omitted in order to simplify the description of the methods for fabricating a semiconductor device according to the embodiments of the present invention. According to the first embodiment of the present invention, a complementary transistor (CMOS) forming an SRAM and a CMOS forming peripheral circuits (core) such as a CPU are formed on the same substrate, i.e., a system-on-chip (SOC) device is fabricated. FIG. 13A and FIG. 13B through FIG. 22A and FIG. 22B show cross-sectional views sequentially illustrating the steps of the method for fabricating a semiconductor device according to the first embodiment of the present invention. In these figures, each of FIG. 13A through FIG. 22A shows a region corresponding the core section of the semiconductor device, and each of FIG. 13B through FIG. 22B shows a region corresponding to the SRAM section of the semiconductor device.

Figure 2A:
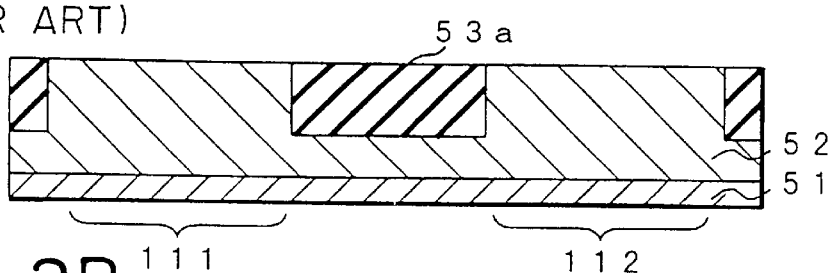
FIG. 2A and FIG. 2B are cross-sectional views each illustrating a conventional method for fabricating a semiconductor device.
Figure 2B:
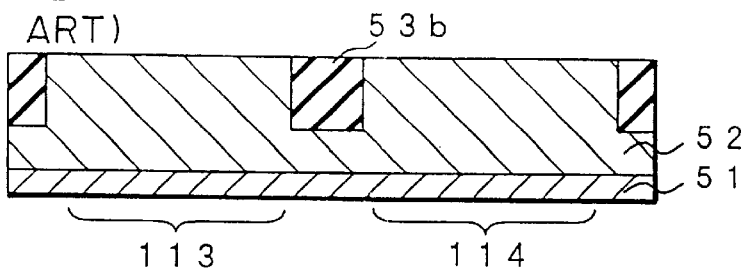
Figure 3A:
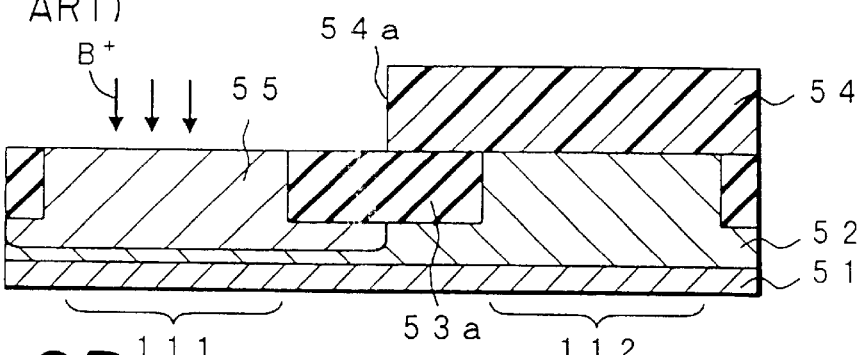
FIG. 3A and FIG. 3B are cross-sectional views each illustrating the next step following the step shown in FIG. 2A and FIG. 2B in the conventional method for fabricating a semiconductor device.
Figure 3B:
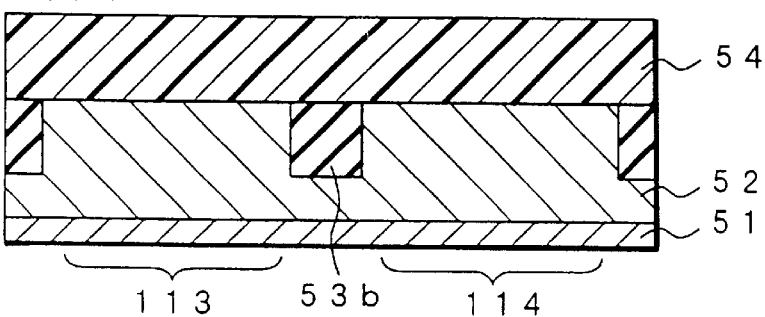
Figure 4A:
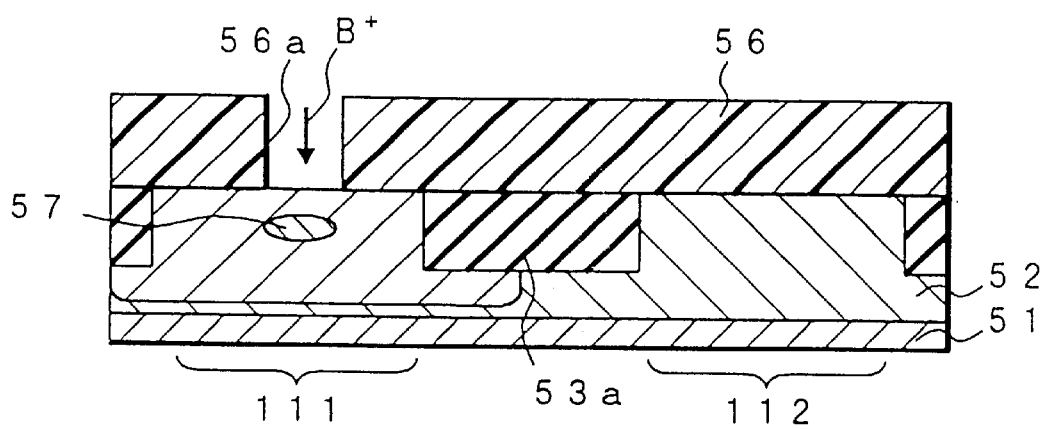
FIG. 4A and FIG. 4B are cross-sectional views each illustrating the next step following the step shown in FIG. 3A and FIG. 3B in the conventional method for fabricating a semiconductor device.
Figure 4B:
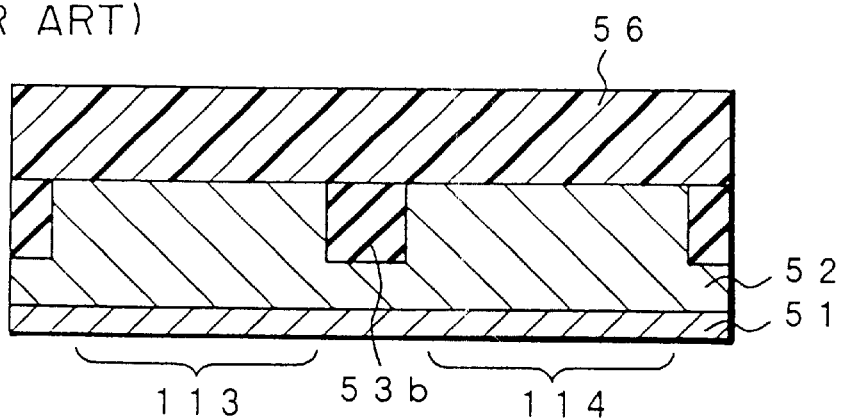
Figure 5A:
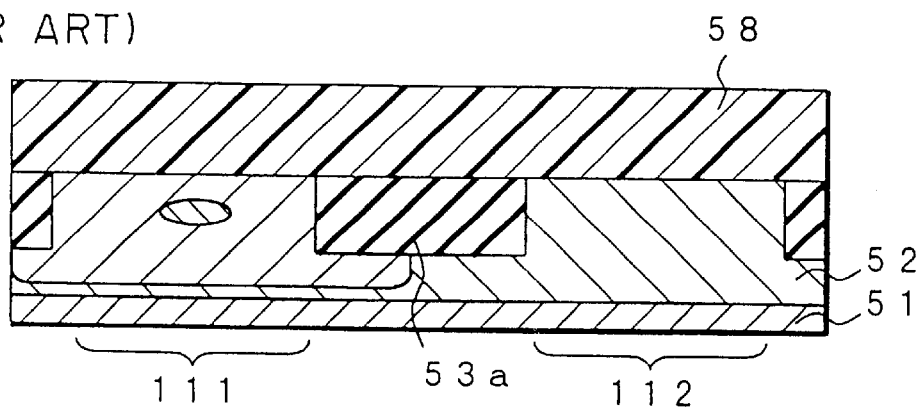
FIG. 5A and FIG. 5B are cross-sectional views each illustrating the next step following the step shown in FIG. 4A and FIG. 4B in the conventional method for fabricating a semiconductor device.
Figure 5B:
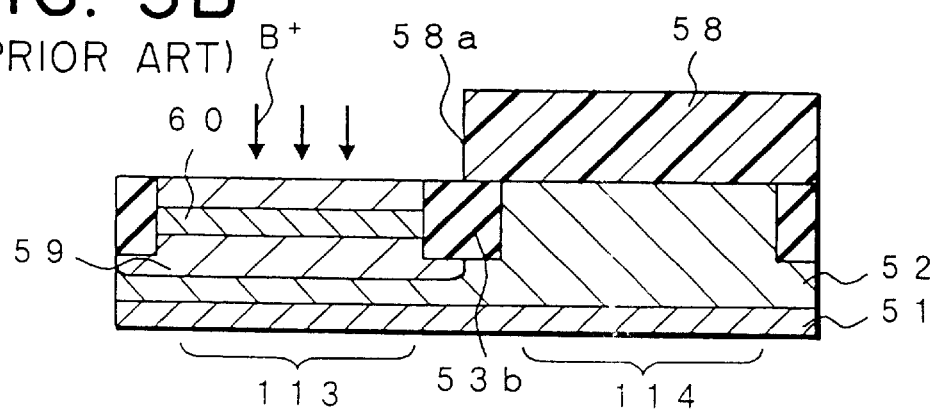
Figure 6A:
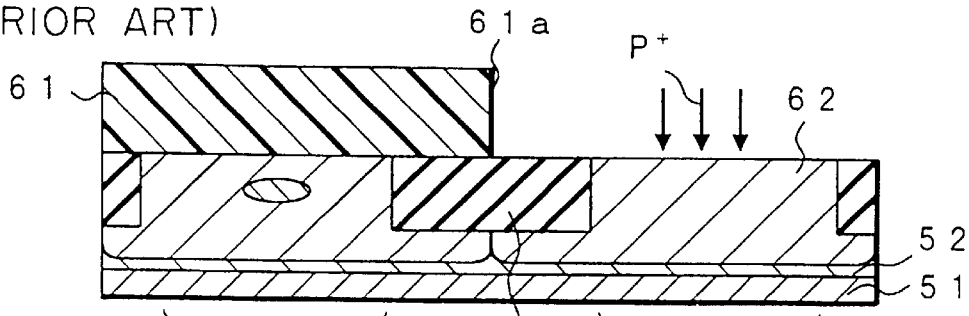
FIG. 6A and FIG. 6B are cross-sectional views each illustrating the next step following the step shown in FIG. 5A and FIG. 5B in the conventional method for fabricating a semiconductor device.
Figure 6B:
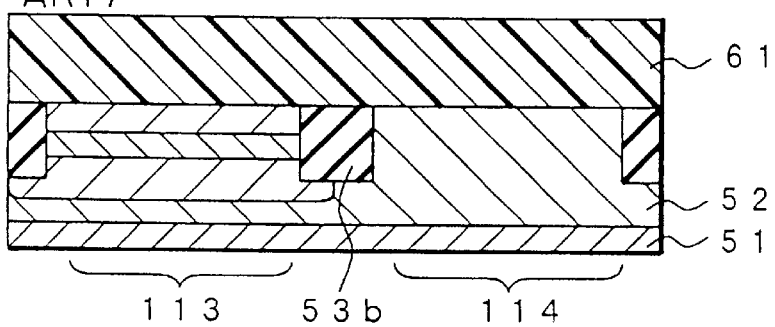
Figure 7A:
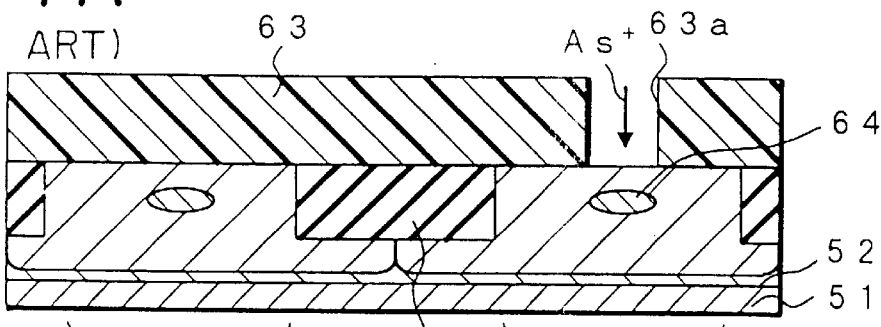
FIG. 7A and FIG. 7B are cross-sectional views each illustrating the next step following the step shown in FIG. 6A and FIG. 6B in the conventional method for fabricating a semiconductor device.
Figure 7B:
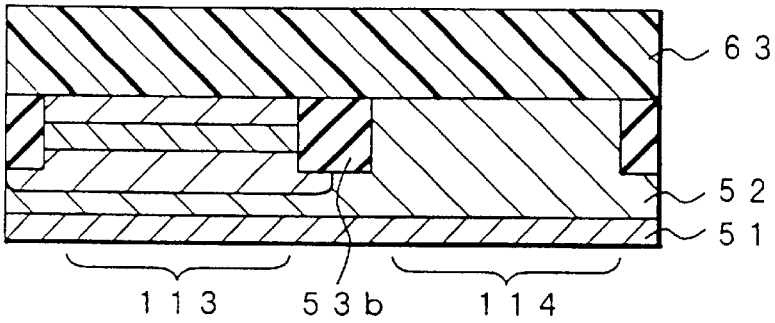
Figure 8A:
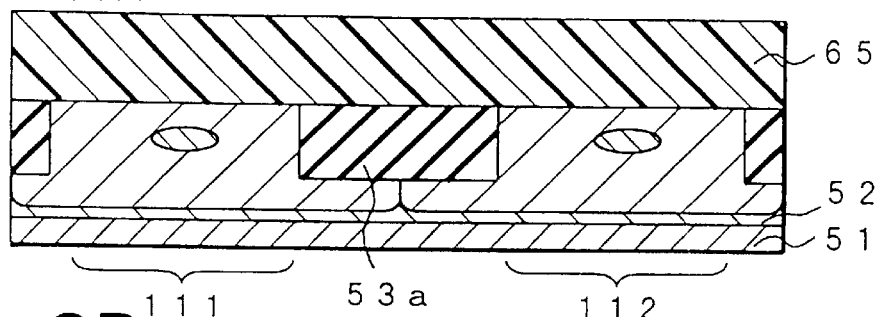
FIG. 8A and FIG. 8B are cross-sectional views each illustrating the next step following the step shown in FIG. 7A and FIG. 7B in the conventional method for fabricating a semiconductor device.
Figure 8B:
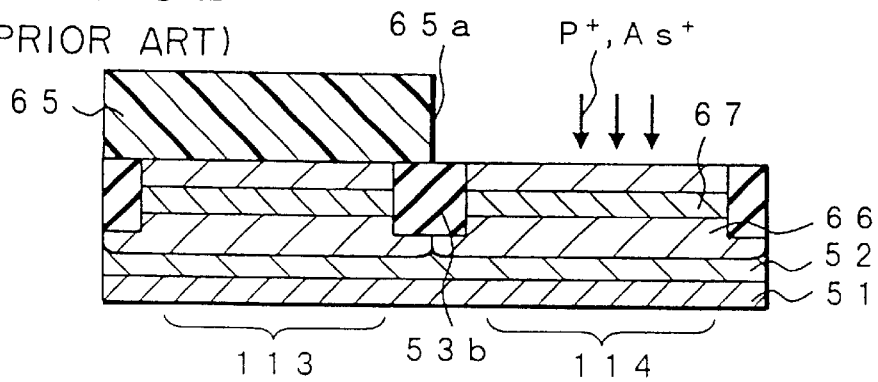
Figure 9A:
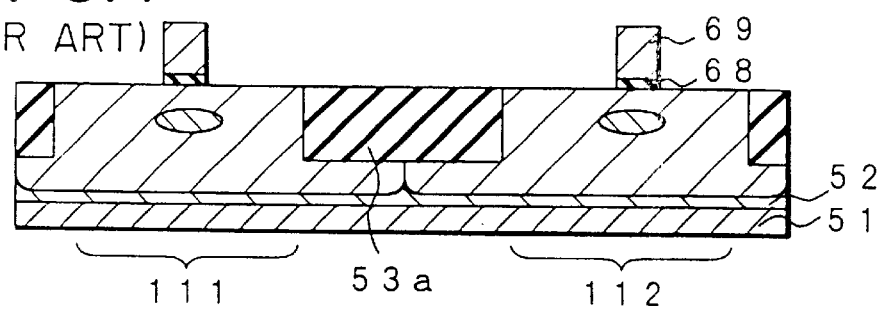
FIG. 9A and FIG. 9B are cross-sectional views each illustrating the next step following the step shown in FIG. 8A and FIG. 8B in the conventional method for fabricating a semiconductor device.
Figure 9B:
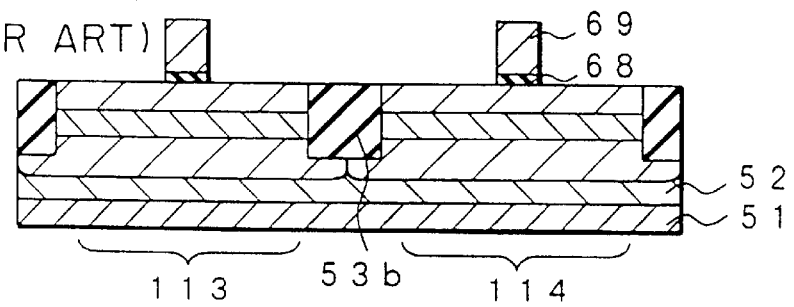
Figure 10A:
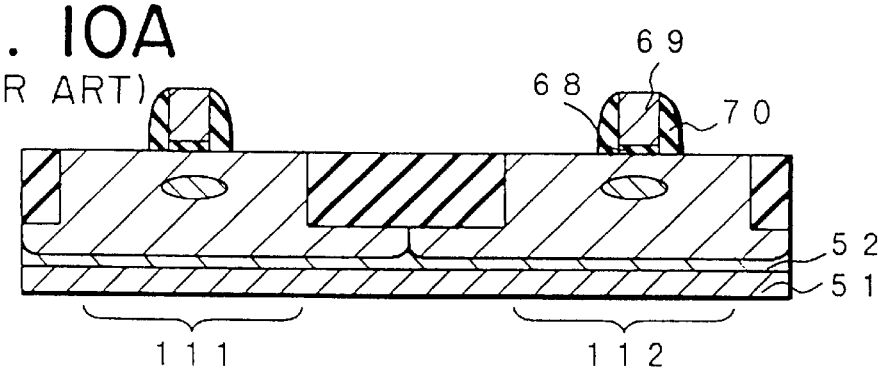
FIG. 10A and FIG. 10B are cross-sectional views each illustrating the next step following the step shown in FIG. 9A and FIG. 9B in the conventional method for fabricating a semiconductor device.
Figure 10B:
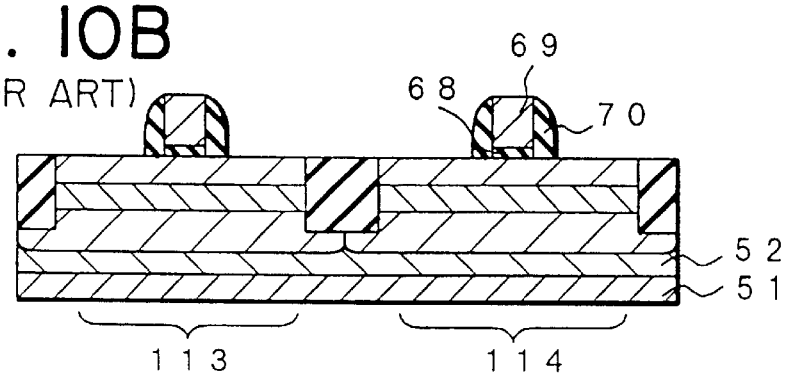
Figure 11A:
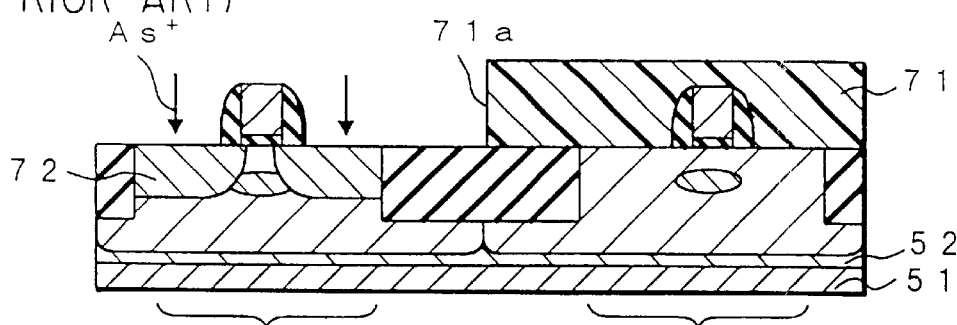
FIG. 11A and FIG. 11B are cross-sectional views each illustrating the next step following the step shown in FIG. 10A and FIG. 10B in the conventional method for fabricating a semiconductor device.
Figure 11B:
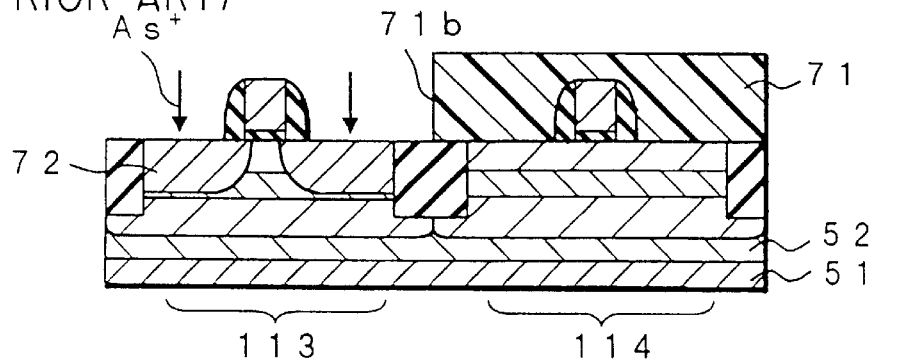
Figure 12A:
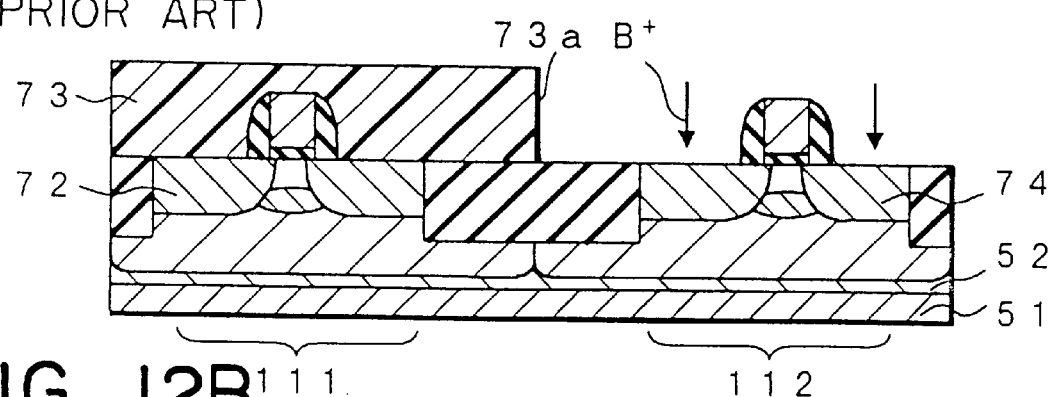
FIG. 12A and FIG. 12B are cross-sectional views each illustrating the next step following the step shown in FIG. 11A and FIG. 11B in the conventional method for fabricating a semiconductor device.
Figure 12B:
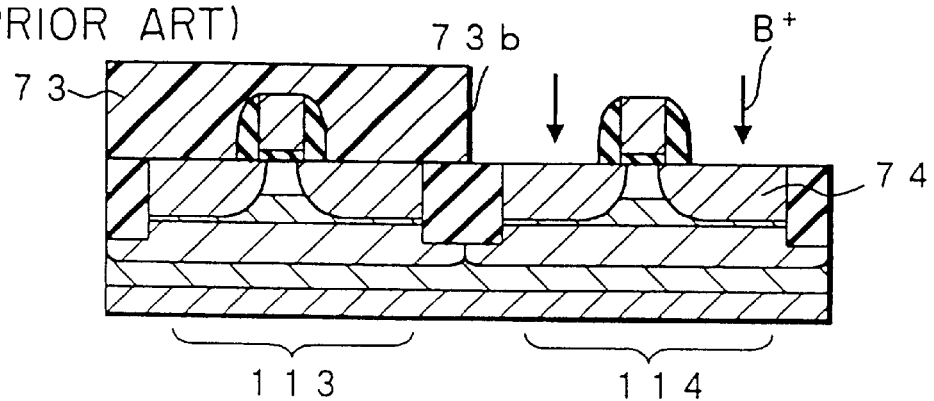
Figure 13A:
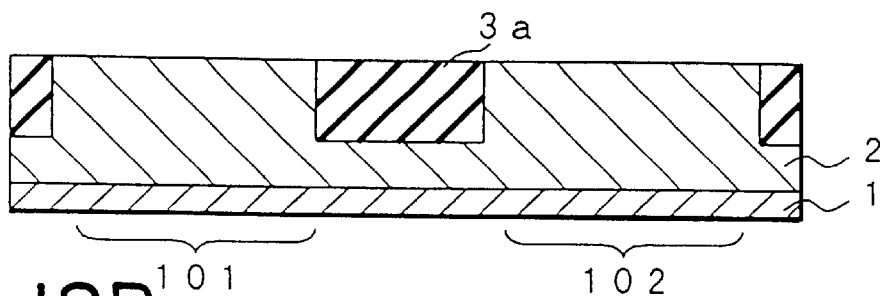
FIG. 13A and FIG. 13B are cross-sectional views each illustrating a step in a method for fabricating a semiconductor device according to a first embodiment of the present invention.
Figure 13B:
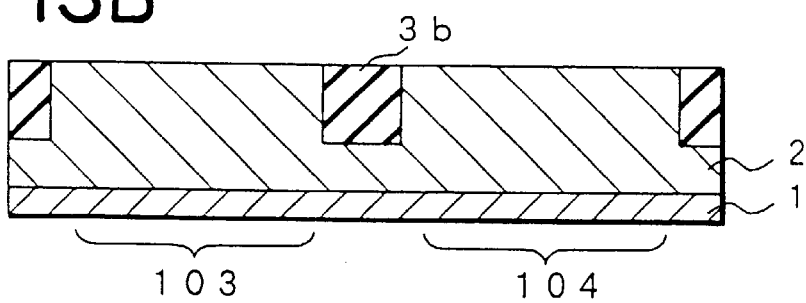

First, as shown in FIG. 13A and FIG. 13B, a p$^-$-epitaxial layer 2 is formed on a p-type silicon substrate 1 in both of the core section and the SRAM section. Next, in the core section, a first device separation film 3a is formed in a predetermined area at the surface of the p$^-$-epitaxial layer 2, and in the SRAM section, a second device separation film 3b is formed in a predetermined area at the surface of the p$^-$-epitaxial layer 2. As a result, the core section is defined into an nMOS region 101 where an n-channel MOS transistor (a second core section MOS transistor) is to be formed, and a pMOS region 102 where a p-channel MOS transistor (a first core section MOS transistor) is to be formed. Furthermore, the SRAM section is defined into an nMOS region 103 where an n-channel MOS transistor (a second memory cell section MOS transistor) is to be formed, and a pMOS region 104 where a p-channel MOS transistor (a first memory cell section MOS transistor) is to be formed. The width of the device separation film 3a is, for example, 0.9 μm, and the width of the device separation film 3b is, for example, 0.4 μm. The device separation films 3a and 3b may be formed by LOCOS oxidization, or by employing a trench structure. Thereafter, a sacrificial oxide film (not shown) is formed over the entire surface of the device.

Figure 14A:
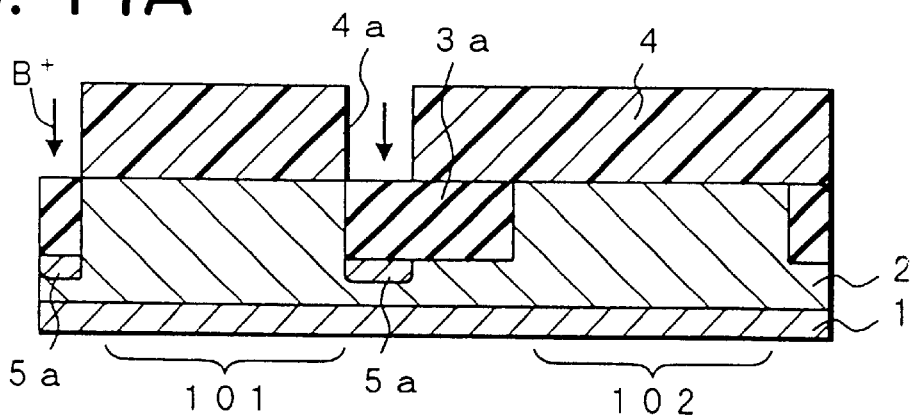
FIG. 14A and FIG. 14B are cross-sectional views each illustrating the next step following the step shown in FIG. 13A and FIG. 13B in the method for fabricating a semiconductor device according to the first embodiment of the present invention.
Figure 14B:
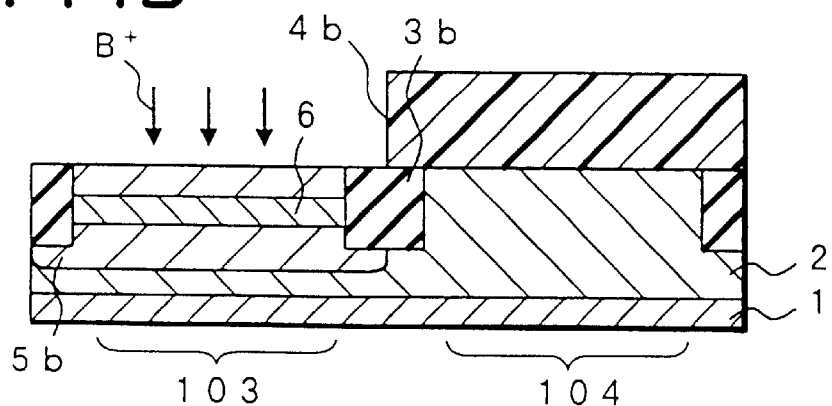

Next, as shown in FIG. 14A, a resist 4 including an opening 4a is formed. The opening 4a extends over a part of the device separation film 3a which is closer to the nMOS region 101. The size of the opening 4a is smaller than a half of the size of the device separation film 3a. In other words, a portion of the device separation film 3a which aligns with the opening 4a is smaller than a portion of the device separation film 3a which is covered by the resist 4. Moreover, as shown in FIG. 14B, the resist 4 also includes an opening 4b. The opening 4b extends over the nMOS region 103 and a part of the device separation film 3b which is closer to the nMOS region 103. The size of a portion of the opening 4b which is located over the device separation film 3b is about a half of the size of the device separation film 3b. Next, B$^+$ ions are implanted using the resist 4 as a mask with an acceleration voltage of 150 keV and a dose of 2×10$^{13}$, for example. Thus, in the core section, a p-type well (a first well of a first conductivity type) 5a is formed under the portion of the device separation film 3a which aligns with the opening 4a. In the SRAM section, a p-type well (a second well of the first conductivity type) 5b which is deeper than the device separation film 3b is formed in the p$^-$-epitaxial layer 2. Then, B$^+$ ions are implanted using the resist 4 as a mask with an acceleration voltage of 30 keV and a dose of 1.5×10$^{13}$, for example, so as to form a p-type channel 6 at an intermediate depth of the p-type well 5b.

As shown in FIG. 15A and FIG. 15B, a resist 7 including an opening 7a is formed after removing the resist 4. The opening 7a is provided in the center of the nMOS region 101, and the resist 7 completely covers the SRAM section. Next, B$^+$ ions are implanted using the resist 7 as a mask, for example, with an acceleration voltage of 30 keV and a dose of 8×10$^{12}$, so as to form a p-type channel 8 at an intermediate depth of the p$^-$-epitaxial layer 2.

As shown in FIG. 16A and FIG. 16B, a resist 9 including an opening 9a is formed after removing the resist 7. The opening 9a extends over the pMOS region 102 and a part of the device separation film 3a which is closer to the pMOS region 102, and the resist 9 completely covers the SRAM section. A portion of the device separation film 3a which is covered by the resist 9 is substantially the same as the portion of the device separation film 3a which aligns with the opening 4a (FIG. 14A). Next, P$^+$ ions are implanted using the resist 9 as a mask, for example, with an acceleration voltage of 600 keV and a dose of $1.5 \times 10^{13}$, so as to form an n-type well (a first well of a second conductivity type) 10 in the p⁻-epitaxial layer 2.

As shown in FIG. 17A and FIG. 17B, a resist 11 including an opening 11*a* is formed after removing the resist 9. The opening 11*a* is provided in the center of the pMOS region 102, and the resist 11 completely covers the SRAM section. Next, As⁺ ions are implanted using the resist 11 as a mask, for example, with an acceleration voltage of 100 keV and a dose of $3 \times 10^{12}$, so as to form an n-type channel 12 at an intermediate depth of the n-type well 10.

As shown in FIG. 18A and FIG. 18B, a resist 13 including an opening 13*a* is formed after removing the resist 11. The opening 13*a* extends over the pMOS region 104 and a part of the device separation film 3*b* which is closer to the pMOS region 104, and the resist 13 completely covers the core section. Next, P⁺ ions are implanted using the resist 13 as a mask, for example, with an acceleration voltage of 350 keV and a dose of $2 \times 10^{13}$, so as to form an n-type well (a second well of the second conductivity type) 14 having a depth greater than that of the device separation film 3*b* in the p⁻-epitaxial layer 2. Furthermore, As⁺ ions are implanted using the resist 13 as a mask with an acceleration voltage of 100 keV and a dose of $1.4 \times 10^{13}$, for example, so as to form an n-type channel 15 at an intermediate depth of the n-type well 14.

As shown in FIG. 19A and FIG. 19B, after removing the resist 13, a gate oxide film 16 and a gate electrode 17 are formed in each of the nMOS region 101, the pMOS region 102, the nMOS region 103, and the pMOS region 104. The thickness of the gate oxide film 16 is, for example, 2.5 nm, and the thickness of the gate electrode 17 is, for example, 150 nm.

Next, as shown in FIG. 20A and FIG. 20B, side walls 18 are formed at both sides of the gate oxide film 16 and the gate electrode 17. The side wall 18 may be of, for example, a silicon oxide film and/or a silicon nitride film or the like, and the width thereof may be 70 nm, for example.

Next, as shown in FIG. 21A and FIG. 21B, a resist 19 having openings 19*a* and 19*b* respectively in the nMOS regions 101 and 103 is formed. Thereafter, As⁺ ions are implanted using the resist 19 as a mask, for example, with an acceleration voltage of 20 keV and a dose of $5 \times 10^{15}$, so as to form an n⁺-source-drain diffusion layer 20 in each of the nMOS regions 101 and 103.

After removing the resist 19, as shown in FIG. 22A and FIG. 22B, a resist 21 having openings 21*a* and 21*b* respectively in the pMOS regions 102 and 104 is formed. Thereafter, using the resist 21 as a mask, B⁺ ions are implanted, for example, with an acceleration voltage of 4 keV and a dose of $5 \times 10^{15}$, so as to form a p⁺-source-drain diffusion layer 22 in each of the pMOS regions 102 and 104.

Thereafter, the ions implanted into each of the wells and the source-drain diffusion layers are activated by annealing, for example, for ten seconds at 1000° C. Next, wiring or the like is provided according to a conventional method. In this manner, the semiconductor device is completed.

As shown in FIG. 22A and FIG. 22B, the semiconductor device fabricated according to the method of the first embodiment of the present invention includes the p-type well 5*a* having an impurity concentration higher than that of the p⁻-epitaxial layer 2 under a part of the device separation film 3*a* which is closer to the nMOS region 101. As a result, punch-through between the n-type source-drain diffusion layer 20 and the n-type well 10 is well suppressed. Thus, the width of the device separation film 3*a* can be reduced as compared to that in the semiconductor device fabricated according to the conventional method, thereby making it possible to reduce the chip area.

Moreover, since the n⁺-source-drain diffusion layer 20 is formed directly on the p⁻-epitaxial layer 2, a junction capacitance Cj in the core section is reduced, thereby realizing a high-speed operation.

Furthermore, since the p-type well 5*a* and the p-type well 5*b* in the SRAM section can be simultaneously formed, it is possible to prevent an increase in the number of the fabrication steps.

Next, the second embodiment of the present invention will be described. the second embodiment achieves a greater chip area reduction than that of the first embodiment. FIG. 23A and FIG. 23B through FIG. 32A and FIG. 32B show cross-sectional views sequentially illustrating the steps of a method for fabricating a semiconductor device according to the second embodiment of the present invention. In these figures, each of FIG. 23A through FIG. 32A shows a region corresponding the core section of the semiconductor device, and each of FIG. 23B through FIG. 32B shows a region corresponding to the SRAM section of the semiconductor device. In the second embodiment illustrated in FIG. 23A and FIG. 23B through FIG. 32A and FIG. 32B, components same as those in the first embodiment illustrated in FIG. 13A and FIG. 13B through FIG. 22A and FIG. 22B will be denoted by the same reference numerals as those in the first embodiment, and the detailed description thereof will be omitted.

First, as shown in FIG. 23A and FIG. 23B, a p⁻-epitaxial layer 2 is formed on a p-type silicon substrate 1 in both of the core section and the SRAM section. Next, in the core section, a device separation film 31 is formed in a predetermined area at the surface of the p⁻-epitaxial layer 2, and in the SRAM section, a device separation film 3*b* is formed in a predetermined area at the surface of the p⁻-epitaxial layer 2. As a result, the core section is defined into an nMOS region 101 and a pMOS region 102; and the SRAM section is defined into an nMOS region 103 and a pMOS region 104. The width of the device separation film 31 is smaller than that of the device separation film 3*a* of the first embodiment. The width of the device separation film 31 is, for example, 0.6 μm. Thereafter, a sacrificial oxide film (not shown) is formed over the entire surface of the device.

Next, as shown in FIG. 24A, a resist 4 including an opening 4*a* is formed. The opening 4*a* extends over a part of the device separation film 31 which is closer to the nMOS region 101. The size of the opening 4*a* is about a half of the size of the device separation film 31. As shown in FIG. 24B, the resist 4 also includes an opening 4*b*. The opening 4*b* extends over the nMOS region 103 and a part of the device separation film 3*b* which is closer to the nMOS region 103. The size of a portion of the opening 4*b* which is located over the device separation film 3*b* is about a half of the size of the device separation film 3*b*. Next, B⁺ ions are implanted using the resist 4 as a mask with an acceleration voltage of 150 keV and a dose of $2 \times 10^{13}$, for example. Thus, in the core section, a p-type well 5*a* is formed under a portion of the device separation film 31 which aligns with the opening 4*a*, and in the SRAM section, a p-type well 5*b* having a depth greater than that of the device separation film 3*b* is formed in the p⁻-epitaxial layer 2. Then, B⁺ ions are implanted using the resist 4 as a mask with an acceleration voltage of 30 keV and a dose of $1.5 \times 10^{13}$, for example, so as to form a p-type channel 6 at an intermediate depth of the p-type well 5*b*.

As shown in FIG. 25A and FIG. 25B, a resist 7 including an opening 7*a* is formed after removing the resist 4. The opening 7a is provided in the center of the nMOS region 101, and the resist 7 completely covers the SRAM section. Next, B$^+$ ions are implanted using the resist 7 as a mask, for example, with an acceleration voltage of 30 keV and a dose of $8\times10^{12}$, so as to form a p-type channel 8 at an intermediate depth of the p$^-$-epitaxial layer 2.

As shown in FIG. 26A and FIG. 26B, a resist 32 which includes an opening 32a and completely covers the SRAM section is formed after removing the resist 7. The opening 32a extends over the pMOS region 102. Next, using the resist 32 as a mask, P$^+$ ions are implanted, for example, with an acceleration voltage of 600 keV and a dose of $1.5\times10^{13}$, and B$^+$ ions are then implanted, for example, with an acceleration voltage of 170 keV and a dose of $3\times10^{12}$, so as to form an n-type well (a first well of the second conductivity type) 33 in the p$^-$-epitaxial layer 2. The size of the opening 32a in the second embodiment is smaller than that of the opening 9a (FIG. 16A) in the first embodiment, the n-type well 33 and the p-type well 5a are spaced apart from each other. After the implantation of P$^+$ (n-type) ions, B$^+$ (p-type) ions are implanted. As a result, the effective n-type impurity concentration of the n-type well 33 is reduced. The B$^+$ ion implantation is not always necessary.

As shown in FIG. 27A and FIG. 27B, a resist 11 which includes an opening 11a in the center of the pMOS region 102 and completely covers the SRAM section is formed after removing the resist 32. Next, using the resist 11 as a mask, P$^+$ ions are implanted, for example, with an acceleration voltage of 240 keV and a dose of $5\times10^{12}$, and As$^+$ ions are then implanted, for example, with an acceleration voltage of 100 keV and a dose of $3\times10^{12}$, so as to form an n-type channel 34 at an intermediate depth of the n-type well 33. The height of the n-type channel 34 is greater than that of the n-type channel 12 (FIG. 18A) in the first embodiment.

As shown in FIG. 28A, a resist 35 including an opening 35a is formed after removing the resist 11. The opening 35a extends over a part of the device separation film 31 which is closer to the pMOS region 102. The size of the opening 35a is about a half of the size of the device separation film 31. As shown in FIG. 28B, the resist 35 also includes an opening 35b. The opening 35b extends over the pMOS region 104 and a part of the device separation film 3b which is closer to the pMOS region 104. The size of a part of the opening 35b which is located over the device separation film 3b is about a half of the size of the device separation film 3b. Next, P$^+$ ions are implanted using the resist 35 as a mask with an acceleration voltage of 350 keV and a dose of $2\times10^{13}$, for example. As a result, in the core section, an n-type well (a third well of the second conductivity type) 36a is formed under a portion of the device separation film 31 which aligns with the opening 35a; and in the SRAM section, an n-type well 36b having a depth greater than that of the device separation film 3b is formed in the p$^-$-epitaxial layer 2. Then, As$^+$ ions are implanted using the resist 35 as a mask with an acceleration voltage of 100 keV and a dose of $1.4\times10^{13}$, for example, so as to form an n-type channel 37 at an intermediate depth of the n-type well 36b.

As shown in FIG. 29A and FIG. 29B, after removing the resist 35, a gate oxide film 16 and a gate electrode 17 are formed in each of the nMOS region 101, the pMOS region 102, the nMOS region 103, and the pMOS region 104.

Next, as shown in FIG. 30A and FIG. 30B, side walls 18 are formed at both sides of the gate oxide film 16 and the gate electrode 17. The side wall 18 may be of, for example, a silicon oxide film and/or a silicon nitride film or the like.

Next, as shown in FIG. 31A and FIG. 31B, a resist 19 having openings 19a and 19b respectively in the nMOS regions 101 and 103 is formed. Thereafter, As$^+$ ions are implanted using the resist 19 as a mask, for example, with an acceleration voltage of 20 keV and a dose of $5\times10^{15}$, so as to form an n$^+$-source-drain diffusion layer 20 in each of the nMOS regions 101 and 103.

After removing the resist 19, as shown in FIG. 32A and FIG. 32B, a resist 21 having openings 21a and 21b respectively in the pMOS regions 102 and 104 is formed. Thereafter, using the resist 21 as a mask, B$^+$ ions are implanted, for example, with an acceleration voltage of 4 keV and a dose of $5\times10^{15}$, so as to form a p$^+$-source-drain diffusion layer 22 in each of the pMOS regions 102 and 104.

Thereafter, the ions implanted into each of the wells and the source-drain diffusion layers are activated by annealing. Next, wiring or the like is provided according to a conventional method. In this manner, the semiconductor device is completed.

As shown in FIG. 32A and FIG. 32B, the semiconductor device fabricated according to the method of the second embodiment of the present invention includes not only the p-type well 5a under a part of the device separation film 31 which is closer to the nMOS region 101, but also the n-type well 36a having an impurity concentration higher than that of the n-type well 33 under a part of the device separation film 31 which is closer to the pMOS region 102. As a result, punch-through between the n-type source-drain diffusion layer 20 and the n-type well 33 and punch-through between the p-type source-drain diffusion layer 22 and the p-type epitaxial layer 2 are well suppressed. Thus, the width of the device separation film 31 can be further reduced, thereby making it possible to further reduce the chip area.

Moreover, since the effective n-type impurity concentration of the n-type well 33 is smaller than that of the n-type well 10 in the first embodiment, a junction capacitance Cj in the core section is further reduced, thereby realizing a faster operation.

Furthermore, since the n-type well 36a can be simultaneously formed when the n-type well 36b in the SRAM section is formed, it is possible to prevent an increase in the number of the fabrication steps.

Next, the third embodiment of the present invention will be described. The third embodiment achieves a reduction in the number of the fabrication steps as compared to that in the first embodiment. FIG. 33A and FIG. 33B through FIG. 41A and FIG. 41B show cross-sectional views sequentially illustrating the steps of a method for fabricating a semiconductor device according to the third embodiment of the present invention. In these figures, each of FIG. 33A through FIG. 41A shows a region corresponding the core section of the semiconductor device, and each of FIG. 33B through FIG. 41B shows a region corresponding to the SRAM section of the semiconductor device. In the third embodiment illustrated in FIG. 33A and FIG. 33B through FIG. 41A and FIG. 41B, components same as those in the first embodiment illustrated in FIG. 13A and FIG. 13B through FIG. 22A and FIG. 22B will be denoted by the same reference numerals as those in the first embodiment, and the description thereof will be omitted.

First, as shown in FIG. 33A and FIG. 33B, a p$^-$-epitaxial layer 2 is formed on a p-type silicon substrate 1 in both of the core section and the SRAM section. Next, in the core section, a device separation film 3a is formed in a predetermined area at the surface of the p$^-$-epitaxial layer 2, and in the SRAM section, a device separation film 3b is formed in a predetermined area at the surface of the p$^-$-epitaxial layer 2. As a result, an nMOS region 101 and a pMOS region 102 are separated from each other; and an nMOS region 103 and a pMOS region 104 are defined. Thereafter, a sacrificial oxide film (not shown) is formed over the entire surface of the device.

Next, as shown in FIG. 34A, a resist 4 including an opening 4a is formed. The opening 4a extends over a part of the device separation film 3a which is closer to the nMOS region 101. As shown in FIG. 34B, the resist 4 also includes an opening 4b. The opening 4b extends over the nMOS region 103 and a part of the device separation film 3b which is closer to the nMOS region 103. Next, $B^+$ ions are implanted using the resist 4 as a mask with an acceleration voltage of 150 keV and a dose of $2 \times 10^{13}$, for example. As a result, in the core section, a p-type well 5a is formed under a portion of the device separation film 3a which aligns with the opening 4a; and in the SRAM section, a p-type well 5b having a depth greater than that of the device separation film 3b is formed in the $p^-$-epitaxial layer 2. Then, $B^+$ ions are implanted using the resist 4 as a mask with an acceleration voltage of 30 keV and a dose of $1.5 \times 10^{13}$, for example, so as to form a p-type channel 6 at an intermediate depth of the p-type well 5b.

As shown in FIG. 35A and FIG. 35B, a resist 7 including an opening 7a is formed after removing the resist 4. The opening 7a is provided in the center of the nMOS region 101, and the resist 7 completely covers the SRAM section. Next, $B^+$ ions are implanted using the resist 7 as a mask, for example, with an acceleration voltage of 30 keV and a dose of $8 \times 10^{12}$, so as to form a p-type channel 8 at an intermediate depth of the $p^-$-epitaxial layer 2.

As shown in FIG. 36A and FIG. 36B, after removing the resist 7, a resist 9 which includes an opening 9a and completely covers the SRAM section is formed. The opening 9a extends over the pMOS region 102 and a part of the device separation film 3a which is closer to the pMOS region 102. A portion of the device separation film 3a which is covered by the resist 9 is substantially the same as the region aligned with the opening 4a (FIG. 34). Next, using the resist 9 as a mask, $P^+$ ions are implanted, for example, with an acceleration voltage of 600 keV and a dose of $1.5 \times 10^{13}$. As a result, in the core section, an n-type well 10 having a depth greater than that of the p-type well 5a is formed in the $p^-$-epitaxial layer 2. Then, $As^+$ ions are implanted using the resist 9 as a mask, for example, with an acceleration voltage of 100 keV and a dose of $3 \times 10^{12}$, so as to form an n-type channel 41 at an intermediate depth of the n-type well 10.

As shown in FIG. 37A and FIG. 37B, a resist 13 including an opening 13a is formed after removing the resist 9. The opening 13a extends over the pMOS region 104 and a part of the device separation film 3b which is closer to the pMOS region 104, and the resist 13 completely covers the core section. Next, $P^+$ ions are implanted using the resist 13 as a mask, for example, with an acceleration voltage of 350 keV and a dose of $2 \times 10^{13}$. As a result, in the SRAM section, an n-type well 14 having a depth greater than that of the device separation film 3b is formed in the $p^-$-epitaxial layer 2. Then, $As^+$ ions are implanted using the resist 13 as a mask with an acceleration voltage of 100 keV and a dose of $1.4 \times 10^{13}$, for example, thereby forming an n-type channel 15 at an intermediate depth of the n-type well 14.

As shown in FIG. 38A and FIG. 38B, after removing the resist 13, a gate oxide film 16 and a gate electrode 17 are formed in each of the nMOS region 101, the pMOS region 102, the nMOS region 103, and the pMOS region 104.

Next, as shown in FIG. 39A and FIG. 39B, side walls 18 are formed at both sides of the gate oxide film 16 and the gate electrode 17. The side wall 18 may be of, for example, a silicon oxide film and/or a silicon nitride film or the like.

Next, as shown in FIG. 40A and FIG. 40B, a resist 19 having openings 19a and 19b respectively in the nMOS regions 101 and 103 is formed. Thereafter, $As^+$ ions are implanted using the resist 19 as a mask, for example, with an acceleration voltage of 20 keV and a dose of $5 \times 10^{15}$, so as to form an $n^+$-source-drain diffusion layer 20 in each of the nMOS regions 101 and 103.

As shown in FIG. 41A and FIG. 41B, after removing the resist 19, a resist 21 having openings 21a and 21b respectively in the pMOS regions 102 and 104 is formed. Thereafter, using the resist 21 as a mask, $B^+$ ions are implanted, for example, with an acceleration voltage of 4 keV and a dose of $5 \times 10^{15}$, so as to form a $p^+$-source-drain diffusion layer 22 in each of the pMOS regions 102 and 104.

Thereafter, the ions implanted into each of the wells and the source-drain diffusion layers are activated by annealing. Next, wiring or the like is provided according to a conventional method. In this manner, the semiconductor device is completed.

According to the third embodiment of the present invention, the n-type well 10 and the n-type channel 41 are formed using the resist 9. As a result, the number of the fabrication steps in the third embodiment is smaller than that in the first embodiment.

Moreover, according to the semiconductor device fabricated by the method of the third embodiment of the present invention, as shown in FIG. 41A and FIG. 41B, the p-type well 5a is provided under a part of the device separation film 3a which is closer to the nMOS region 101. As a result, punch-through between the n-type source-drain diffusion layer 20 and the n-type well 10 is well suppressed, thereby making it possible to reduce the chip area. As shown in FIG. 41A, however, since the n-type channel 41 extends between the device separation films, a slight increase in a junction capacitance Cj may be expected as compared to the first embodiment.

Next, the fourth embodiment of the present invention will be described. The fourth embodiment achieves a reduction in the number of the fabrication steps as compared to that in the second embodiment. FIG. 42A and FIG. 42B through FIG. 50A and FIG. 50B show cross-sectional views sequentially illustrating the steps of a method for fabricating a semiconductor device according to the fourth embodiment of the present invention. In these figures, each of FIG. 42A through FIG. 50A shows a region corresponding to the core section of the semiconductor device, and each of FIG. 42B through FIG. 50B shows a region corresponding to the SRAM section of the semiconductor device. In the fourth embodiment illustrated in FIG. 42A and FIG. 42B through FIG. 50A and FIG. 50B, components same as those in the second embodiment illustrated in FIG. 23A and FIG. 23B through FIG. 32A and FIG. 32B will be denoted by the same reference numerals as those in the second embodiment, and the detailed description thereof will be omitted.

First, as shown in FIG. 42A and FIG. 42B, a $p^-$-epitaxial layer 2 is formed on a p-type silicon substrate 1 in both of the core section and the SRAM section. Next, in the core section, a device separation film 31 is formed in a predetermined area at the surface of the $p^-$-epitaxial layer 2, and in the SRAM section, a device separation film 3b is formed in a predetermined area at the surface of the $p^-$-epitaxial layer 2. As a result, an nMOS region 101 and a pMOS region 102 are defined in the core section; and an nMOS region 103 and a pMOS region 104 are defined in the SRAM section.

Thereafter, a sacrificial oxide film (not shown) is formed over the entire surface of the device.

Next, as shown in FIG. 43A, a resist 4 including an opening 4a is formed. The opening 4a extends over a part of the device separation film 31 which is closer to the nMOS region 101. As shown in FIG. 43B, the resist 4 also includes an opening 4b. The opening 4b extends over the nMOS region 103 and a part of the device separation film 3b which is closer to the nMOS region 103. Next, B$^+$ ions are implanted using the resist 4 as a mask with an acceleration voltage of 150 keV and a dose of $2\times10^{13}$, for example. As a result, in the core section, a p-type well 5a is formed under a portion of the device separation film 31 which aligns with the opening 4a; and in the SRAM section, a p-type well 5b having a depth greater than that of the device separation film 3b is formed in the p$^-$-epitaxial layer 2. Then, B$^+$ ions are implanted using the resist 4 as a mask with an acceleration voltage of 30 keV and a dose of $1.5\times10^{13}$, for example, so as to form a p-type channel 6 at an intermediate depth of the p-type well 5b.

As shown in FIG. 44A and FIG. 44B, a resist 7 including an opening 7a is formed after removing the resist 4. The opening 7a is provided in the center of the nMOS region 101, and the resist 7 completely covers the SRAM section. Next, B$^+$ ions are implanted using the resist 7 as a mask, for example, with an acceleration voltage of 30 keV and a dose of $8\times10^{12}$, so as to form a p-type channel 8 at an intermediate depth of the p$^-$-epitaxial layer 2.

As shown in FIG. 45A and FIG. 45B, after removing the resist 7, a resist 32 which includes an opening 32a and completely covers the SRAM section is formed. The opening 32a extends over the pMOS region 102. Next, using the resist 32 as a mask, P$^+$ ions are implanted, for example, with an acceleration voltage of 600 keV and a dose of $1.5\times10^{13}$, so as to form in the core section an n-type well 33 having a depth greater than that of the p-type well 5a in the p$^-$-epitaxial layer 2. Then, using the resist 32 as a mask, As$^+$ ions are implanted, for example, with an acceleration voltage of 100 keV and a dose of $3\times10^{12}$, so as to form an n-type channel 42 at an intermediate depth of the n-type well 33.

As shown in FIG. 46A and FIG. 46B, a resist 35 including an opening 35a is formed after removing the resist 32. The opening 35a extends over a part of the device separation film 31 which is closer to the pMOS region 102. As shown in FIG. 46B, the resist 35 also includes an opening 35b. The opening 35b extends over the pMOS region 104 and a part of the device separation film 3b which is closer to the pMOS region 104. Next, P$^+$ ions are implanted using the resist 35 as a mask with an acceleration voltage of 350 keV and a dose of $2\times10^{13}$, for example. As a result, in the core section, an n-type well 36a is formed under a portion of the device separation film 31 which aligns with the opening 35a; and in the SRAM section, an n-type well 36b having a depth greater than that of the device separation film 3b is formed in the p$^-$-epitaxial layer 2. Then, As$^+$ ions are implanted using the resist 35 as a mask with an acceleration voltage of 100 keV and a dose of $1.4\times10^{13}$, for example, so as to form an n-type channel 37 at an intermediate depth of the n-type well 36b.

As shown in FIG. 47A and FIG. 47B, after removing the resist 35, a gate oxide film 16 and a gate electrode 17 are formed in each of the nMOS region 101, the pMOS region 102, the nMOS region 103, and the pMOS region 104.

Next, as shown in FIG. 48A and FIG. 48B, side walls 18 are formed at both sides of the gate oxide film 16 and the gate electrode 17. The side wall 18 may be of, for example, a silicon oxide film and/or a silicon nitride film or the like.

Next, as shown in FIG. 49A and FIG. 49B, a resist 19 having openings 19a and 19b respectively in the nMOS regions 101 and 103 is formed. Thereafter, As$^+$ ions are implanted using the resist 19 as a mask, for example, with an acceleration voltage of 20 keV and a dose of $5\times10^{15}$, so as to form an n$^+$-source-drain diffusion layer 20 in each of the nMOS regions 101 and 103.

After removing the resist 19, as shown in FIG. 50A and FIG. 50B, a resist 21 having openings 21a and 21b respectively in the pMOS regions 102 and 104 is formed. Thereafter, using the resist 21 as a mask, B$^+$ ions are implanted, for example, with an acceleration voltage of 4 keV and a dose of $5\times10^{15}$, so as to form a p$^+$-source-drain diffusion layer 22 in each of the pMOS regions 102 and 104.

Thereafter, the ions implanted into each of the wells and the source-drain diffusion layers are activated by annealing. Next, wiring or the like is provided according to a conventional method. In this manner, the semiconductor device is completed.

Thus, according to the fourth embodiment of the present invention, since the n-type well 33 and the n-type channel 42 are formed using the resist 32, the number of the fabrication steps in the fourth embodiment is smaller than that in the second embodiment.

As shown in FIG. 50A and FIG. 50B, the semiconductor device fabricated according to the method of the fourth embodiment of the present invention includes the p-type well 5a under a portion of the device separation film 31 which is closer to the nMOS region 101, and the n-type well 36a having an impurity concentration higher than that of the n-type well 33 under a part of the device separation film 31 which is closer to the pMOS region 102. As a result, punch-through between the n-type source-drain diffusion layer 20 and the n-type well 33 and punch-through between the p-type source-drain diffusion layer 22 and the p-type epitaxial layer 2 are well suppressed. Thus, the width of the device separation film 31 can be further reduced, thereby making it possible to further reduce the chip area. As shown in FIG. 50A, however, since the n-type channel 42 extends between the device separation films, a slight increase in a junction capacitance Cj may be expected as compared to the second embodiment.

The conductivity type of the semiconductor substrate is not limited to a p type, but can alternatively be an n type. When an n-type semiconductor substrate is used, the conductivity type of each of the wells and diffusion layers should be opposite to that described in the aforementioned embodiments.

As described above in detail, according to the embodiments, the well of a first conductivity type which has an impurity concentration higher than that of the semiconductor substrate is provided in the core section under a part of the device separation film closer to the second core section MOS transistor, thereby making it possible to improve punch-through resistance under the device separation region. As a result, the width of the device separation film in the core section can be reduced, thereby reducing the area occupied by the core section. Moreover, since the second core section MOS transistor is formed in the semiconductor substrate, the junction capacitance thereof can be reduced as compared to that of a conventional MOS transistor which is provided in a well, thereby realizing a high-speed operation of the core section.

When the third well of a second conductivity type is provided under a part of the device separation film which is closer to the first core section MOS transistor, punch-through resistance under the device separation region can be further increased. As a result, the area occupied by the core section can be further reduced.

Furthermore, since the first well of the first conductivity type and the second well of the first conductivity type are simultaneously formed, punch-through resistance under the device separation region can be improved without increasing the number of the fabrication steps. Also, when fabricating the well of the first core section MOS transistor, ions of the first conductivity type may be implanted with a low dose after ions of the second conductivity type are implanted into the semiconductor substrate. As a result, the effective impurity concentration of the well is reduced, thereby reducing the junction capacitance thereof. Thus, a faster operation is realized.

What is claimed is:

1. A method for fabricating a semiconductor device, comprising the step of forming a core section complementary transistor and a memory cell section complementary transistor on a semiconductor substrate of a first conductivity type, said forming complementary transistors having:

forming a first device separation film and a second device separation film on said semiconductor substrate, wherein
said first device separation film separates a first core section MOS transistor and a second core section MOS transistor from each other, said first and second core section MOS transistors constitute said core section complementary transistor,
said second device separation film separates a first memory cell section MOS transistor and a second memory cell section MOS transistor from each other, said first and second memory cell section MOS transistors constitute said memory cell section complementary transistor,
each of said first core section MOS transistor and said first memory cell section MOS transistor includes source-drain regions of the first conductivity type, and
each of said second core section MOS transistor and said second memory cell section MOS transistor includes source-drain regions of s second conductivity type; and forming a first well of the first conductivity type under a part of said first device separation film which is closer to said second core section MOS transistor, and a second well of the first conductivity type in a region of said semiconductor substrate where said second memory cell section MOS transistor is to be formed, an impurity concentration of each of said first and second wells of the first conductivity type being higher than that of said semiconductor substrate.

2. The method for fabricating a semiconductor device according to claim 1, wherein said forming complementary transistors comprises forming a second well of the second conductivity type in a region of said semiconductor substrate where said first memory cell section MOS transistor is to be formed, and a third well of the second conductivity type under a part of said first device separation film which is closer to said first core section MOS transistor.

3. The method for fabricating a semiconductor device according to claim 1, wherein said forming complementary transistors comprises, after forming a first and second wells of the first conductivity type, sequentially forming a first well of the second conductivity type and a channel of the second conductivity type in a region of said semiconductor substrate where said first memory cell section MOS transistor is to be formed using one mask.

4. The method for fabricating a semiconductor device according to claim 2, wherein said forming complementary transistors comprises, after forming a first and second wells of the first conductivity type, sequentially forming a first well of the second conductivity type and a channel of the second conductivity type in a region of said semiconductor substrate where said first memory cell section MOS transistor is to be formed using a single mask.

5. The method for fabricating a semiconductor device according to claim 1, wherein forming complementary transistors comprises:
implanting ions of the second conductivity type into a region of said semiconductor substrate where said first memory cell section MOS transistor is to be formed after forming said first and second wells of the first conductivity type; and
implanting ions of the first conductivity type into said region of said semiconductor substrate where said first memory cell section MOS transistor is to be formed at a dose smaller than that of said ions of the second conductivity type.

6. The method for fabricating a semiconductor device according to claim 2, wherein forming complementary transistors comprises:
implanting ions of the second conductivity type into a region of said semiconductor substrate where said first memory cell section MOS transistor is to be formed after forming said first and second wells of the first conductivity type; and
implanting ions of the first conductivity type into said region of said semiconductor substrate where said first memory cell section MOS transistor is to be formed at a dose smaller than that of said ions of the second conductivity type.

7. The method for fabricating a semiconductor device according to claim 1, wherein said semiconductor substrate has a semiconductor layer of the first conductivity type which is formed on a base portion of said semiconductor substrate by epitaxial growth and has an impurity concentration lower than that of said base portion.

8. The method for fabricating a semiconductor device according to claim 2, wherein said semiconductor substrate has a semiconductor layer of the first conductivity type which is formed on a base portion of said semiconductor substrate by epitaxial growth and has an impurity concentration lower than that of said base portion.

9. The method for fabricating a semiconductor device according to claim 3, said semiconductor substrate has a semiconductor layer of the first conductivity type which is formed on a base portion of said semiconductor substrate by epitaxial growth and has an impurity concentration lower than that of said base portion.

10. The method for fabricating a semiconductor device according to claim 4, wherein said semiconductor substrate has a semiconductor layer of the first conductivity type which is formed on a base portion of said semiconductor substrate by epitaxial growth and has an impurity concentration lower than that of said base portion.

11. The method for fabricating a semiconductor device according to claim 5, wherein said semiconductor substrate has a semiconductor layer of the first conductivity type which is formed on a base portion of said semiconductor substrate by epitaxial growth and has an impurity concentration lower than that of said base portion.

12. The method for fabricating a semiconductor device according to claim 6, wherein said semiconductor substrate has a semiconductor layer of the first conductivity type which is formed on a base portion of said semiconductor substrate by epitaxial growth and has an impurity concentration lower than that of said base portion.

* * * * *